US010770438B2

(12) United States Patent
Slovin et al.

(10) Patent No.: US 10,770,438 B2
(45) Date of Patent: Sep. 8, 2020

(54) BONDED TWO-DIE DEVICE INCLUDING AN INTEGRATED CIRCUIT (IC) DIE AND A PHASE-CHANGE MATERIAL (PCM) SWITCH DIE

(71) Applicant: Newport Fab, LLC, Newport Beach, CA (US)

(72) Inventors: Gregory P. Slovin, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/672,240

(22) Filed: Nov. 1, 2019

(65) Prior Publication Data
US 2020/0066695 A1 Feb. 27, 2020

Related U.S. Application Data

(60) Division of application No. 16/413,509, filed on May 15, 2019, now Pat. No. 10,566,321, which is a
(Continued)

(51) Int. Cl.
*H01L 21/00* (2006.01)
*H01L 25/16* (2006.01)
(Continued)

(52) U.S. Cl.
CPC ............ *H01L 25/16* (2013.01); *H01L 23/66* (2013.01); *H01L 24/32* (2013.01); *H01L 24/83* (2013.01);
(Continued)

(58) Field of Classification Search
None
See application file for complete search history.

(56) References Cited

U.S. PATENT DOCUMENTS 6,448,576 B1 * 9/2002 Davis .................. H01L 23/5256
257/50
6,969,869 B2 * 11/2005 Hudgens ............. H01L 23/5256
257/50
(Continued)

FOREIGN PATENT DOCUMENTS

WO    WO 2016/028362    2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Evren Seven
(74) *Attorney, Agent, or Firm* — Farjami & Farjami LLP

(57) ABSTRACT

In a method for wafer-to-wafer bonding, an integrated circuit (IC) wafer and a phase-change material (PCM) switch wafer are provided. The IC includes at least one active device, and has an IC substrate side and a metallization side. The PCM switch wafer has a heat spreading side and a radio frequency (RF) terminal side. A heat spreader is formed in the PCM switch wafer. In one approach, the heat spreading side of the PCM switch wafer is bonded to the metallization side of the IC wafer, then a heating element is formed between the heat spreader and a PCM in the PCM switch wafer. In another approach, a heating element is formed between the heat spreader and a PCM in the PCM switch wafer, then the RF terminal side of the PCM switch wafer is bonded to the metallization side of the IC wafer.

19 Claims, 17 Drawing Sheets

Related U.S. Application Data continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, and a continuation-in-part of application No. 16/161,960, filed on Oct. 16, 2018, now Pat. No. 10,644,235.

(51) Int. Cl.
| | |
|---|---|
| *H01L 45/00* | (2006.01) |
| *H01L 23/66* | (2006.01) |
| *H01L 23/00* | (2006.01) |

(52) U.S. Cl.
CPC ............ *H01L 45/06* (2013.01); *H01L 45/126* (2013.01); *H01L 45/1226* (2013.01); *H01L 45/1286* (2013.01); *H01L 45/143* (2013.01); *H01L 45/144* (2013.01); *H01L 45/16* (2013.01); *H01L 2224/32145* (2013.01); *H01L 2224/83896* (2013.01)

(56) References Cited

U.S. PATENT DOCUMENTS

| | | | |
|---|---|---|---|
| 2,014,181 A1 | 7/2014 | Moon | |
| 9,023,688 B1* | 5/2015 | Or-Bach | H01L 23/3677 |
| | | | 257/E21.532 |
| 9,257,647 B2 | 2/2016 | Borodulin | |
| 9,362,492 B2 | 6/2016 | Goktepeli | |
| 9,368,720 B1* | 6/2016 | Moon | H01L 45/1286 |
| 9,444,430 B1 | 9/2016 | Abdo | |
| 9,601,545 B1 | 3/2017 | Tu | |
| 9,640,759 B1* | 5/2017 | Curioni | H01L 45/149 |
| 9,917,104 B1 | 3/2018 | Roizin | |
| 10,128,243 B2 | 11/2018 | Yoo | |
| 10,164,608 B2 | 12/2018 | Belot | |
| 10,529,922 B1 | 1/2020 | Howard | |
| 2006/0246712 A1* | 11/2006 | Kim | H01L 45/141 |
| | | | 438/622 |
| 2007/0075347 A1* | 4/2007 | Lai | H01L 45/128 |
| | | | 257/296 |
| 2008/0142775 A1 | 6/2008 | Chen | |
| 2010/0108970 A1* | 5/2010 | Liu | H01L 45/1233 |
| | | | 257/2 |
| 2011/0291784 A1 | 12/2011 | Nakatsuji | |
| 2013/0187120 A1* | 7/2013 | Redaelli | H01L 45/143 |
| | | | 257/5 |
| 2013/0223124 A1* | 8/2013 | Park | G11C 11/16 |
| | | | 365/96 |
| 2013/0285000 A1* | 10/2013 | Arai | H01L 45/06 |
| | | | 257/3 |
| 2014/0124729 A1* | 5/2014 | Hwang | H01L 43/02 |
| | | | 257/5 |
| 2014/0191181 A1* | 7/2014 | Moon | H01L 27/2409 |
| | | | 257/4 |
| 2014/0264230 A1* | 9/2014 | Borodulin | H01L 45/1206 |
| | | | 257/4 |
| 2014/0339610 A1 | 11/2014 | Rashed | |
| 2015/0048424 A1 | 2/2015 | Tien | |
| 2015/0090949 A1* | 4/2015 | Chang | H01L 45/04 |
| | | | 257/4 |
| 2015/0243886 A1* | 8/2015 | Narayanan | H01L 27/2463 |
| | | | 257/3 |
| 2015/0333131 A1 | 11/2015 | Mojumder | |
| 2016/0035973 A1* | 2/2016 | Raieszadeh | H01L 45/06 |
| | | | 257/4 |
| 2016/0056373 A1 | 2/2016 | Goktepeli | |
| 2017/0092694 A1* | 3/2017 | Brightsky | G11C 13/0069 |
| 2017/0126205 A1 | 5/2017 | Lin | |
| 2017/0243861 A1 | 8/2017 | Wang | |
| 2017/0365427 A1* | 12/2017 | Borodulin | H01L 45/1286 |
| 2018/0138894 A1 | 5/2018 | Belot | |
| 2018/0204930 A1* | 7/2018 | Or-Bach | H01L 27/10897 |
| 2018/0269393 A1* | 9/2018 | Zhang | H01L 45/1293 |
| 2018/0294343 A1* | 10/2018 | Or-Bach | B82Y 10/00 |
| 2019/0013213 A1* | 1/2019 | Or-Bach | H01L 25/0657 |
| 2019/0064555 A1* | 2/2019 | Hosseini | G02F 1/0147 |
| 2019/0067572 A1* | 2/2019 | Tsai | H01L 45/06 |
| 2019/0088721 A1 | 3/2019 | Reig | |
| 2019/0259945 A1* | 8/2019 | Jung | H01L 45/147 |
| 2019/0267214 A1 | 8/2019 | Liu | |
| 2019/0296718 A1 | 9/2019 | Birkbeck | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

US 10,770,438 B2

BONDED TWO-DIE DEVICE INCLUDING AN INTEGRATED CIRCUIT (IC) DIE AND A PHASE-CHANGE MATERIAL (PCM) SWITCH DIE

CLAIMS OF PRIORITY

This is a divisional of application Ser. No. 16/413,509 filed on May 15, 2019. Application Ser. No. 16/413,509 filed on May 15, 2019 ("the parent application") is a continuation-in-part of and claims the benefit of and priority to application Ser. No. 16/103,490 filed on Aug. 14, 2018, titled "Manufacturing RF Switch Based on Phase-Change Material,". The parent application is also a continuation-in-part of and claims the benefit of and priority to application Ser. No. 16/103,587 filed on Aug. 14, 2018, titled "Design for High Reliability RF Switch Based on Phase-Change Material". The parent application is also a continuation-in-part of and claims the benefit of and priority to application Ser. No. 16/103,646 filed on Aug. 14, 2018, titled "PCM RF Switch Fabrication with Subtractively Formed Heater,". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The parent application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

In order to rapidly cool down phase-change materials (PCM), heat must be dissipated from a PCM RF switch by using heat spreading techniques. However, heat spreading techniques for PCM RF switches may pose device design challenges for devices and circuits in large scale integration of integrated circuits (ICs) with PCM RF switches. Conventional fabrication techniques may not be easily compatible with large scale integration of PCM RF switches and ICs. Various modifications in structure have significant impact on thermal energy management that decrease the reliability of PCM RF switches. Accordingly, large scale integration of PCM switches with IC devices and circuits can present significant challenges. Specialty manufacturing is often impractical, and large scale manufacturing generally trades practicality for the ability to control device characteristics.

Thus, there is a need in the art for large scale integration of PCM RF switches with IC devices and circuits.

SUMMARY

The present disclosure is directed to wafer-to-wafer and die-to-wafer bonding of phase-change material (PCM) switches with integrated circuits and bonded two-die devices, substantially as shown in and/or described in connection with at least one of the figures, and as set forth in the claims.

DETAILED DESCRIPTION

Figure 1:
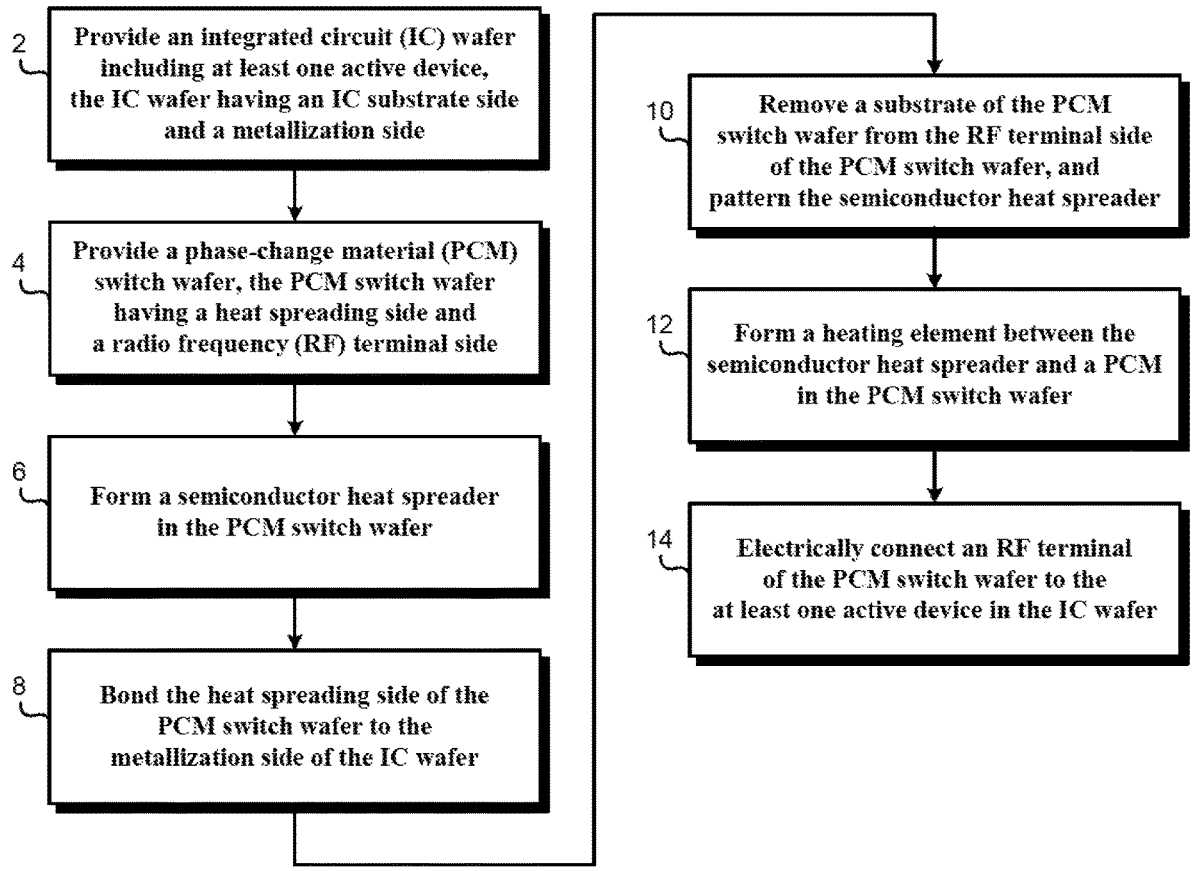
FIG. 1 illustrates a portion of a flowchart of an exemplary fabrication method using a phase-change material (PCM) switch wafer and an integrated circuit (IC) wafer according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of a flowchart of an exemplary fabrication method using a phase-change material (PCM) switch wafer and an integrated circuit (IC) wafer according to one implementation of the present application. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions. Actions 2 through 14 shown in the flowchart of FIG. 1 are sufficient to describe one implementation of the present inventive concepts. Other implementations of the present inventive concepts may utilize actions different from those shown in the flowchart of FIG. 1. Moreover, FIGS. 2 through 10 illustrate structures processed in accordance with the flowchart of FIG. 1.

At the outset, and by way of overview, although the present inventive concepts have been described primarily in relation to wafer-to-wafer bonding, it is understood by one of ordinary skill in the art that the present inventive concepts involving use of bonding techniques to utilize the novel PCM RF switch described in the present application is not limited to wafer-to-wafer bonding techniques or specific actions and materials related to wafer-to-wafer bonding. For example, die-to-wafer bonding manufacturing can be utilized to bond a die including the present application's novel PCM RF switch to an underlying wafer in which the IC resides. In either approach. i.e. wafer-to-wafer bonding or die-to-wafer bonding, the resulting bonded structures can be singulated and packaged to produce a two-die bonded device where the inventive PCM RF switch of the present application resides in a first die while the IC resides in a second die in the final two-die bonded device.

Moreover, although the bonding action is shown and described to occur after a certain metallization level, it is known to those of ordinary skill in the art that the bonding action may occur after any metallization level, not necessarily the specific metallization levels shown in the present application by way of providing specific examples. Further, although oxide-to-oxide bonding has been used as an example in the present application, other bonding methods, such as "fusion bonding," also known as van der Waals bonding, can be employed as well. As other examples, the bonding action can take place by various glue or adherent attachment methods.

Figure 2:
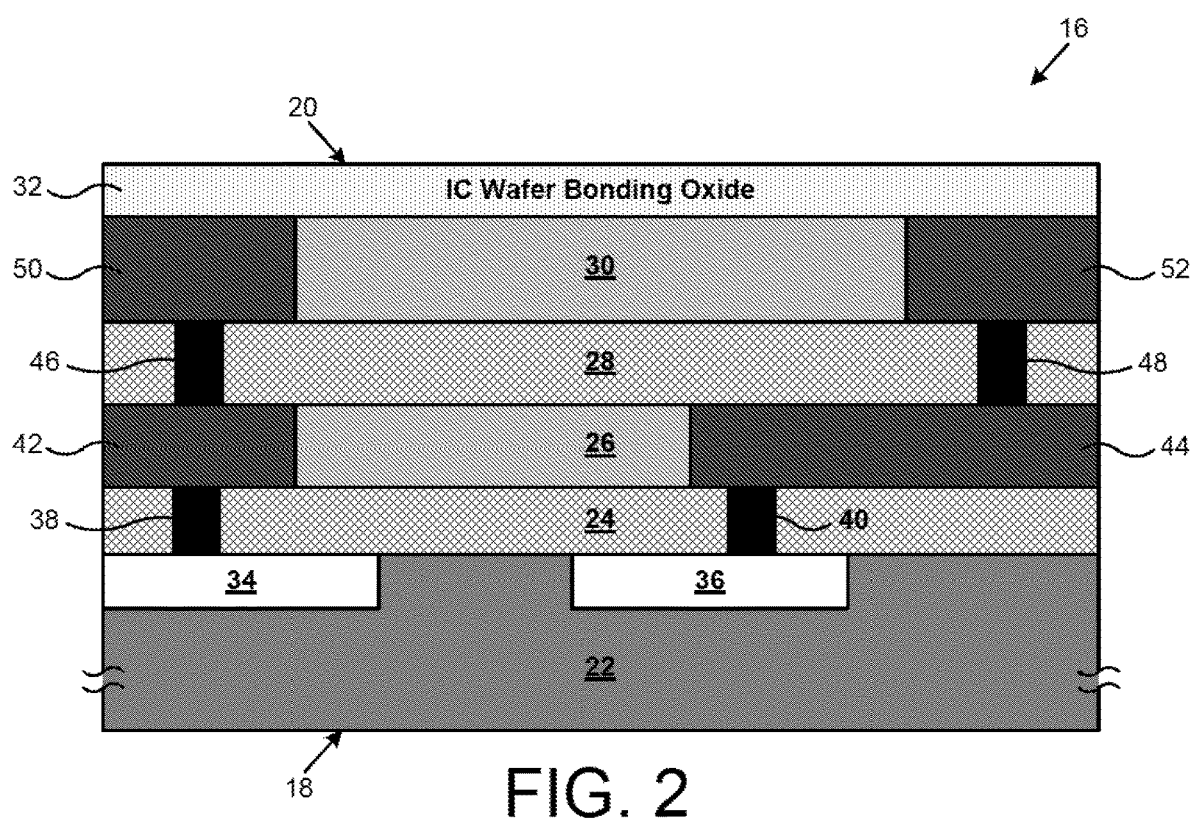
FIG. 2 illustrates a cross-sectional view of a portion of a structure processed in accordance with the flowchart of FIG. 1 according to one implementation of the present application.

Referring to FIG. 2, IC wafer 16 illustrates a cross-sectional view of a portion of a structure processed in accordance with action 2 in the flowchart of FIG. 1 according to one implementation of the present application. As shown in FIG. 2, IC wafer 16 has substrate side 18 and metallization side 20. IC wafer 16 also includes substrate 22, pre-metal dielectric 24, first metallization level 26, interlayer dielectric 28, second metallization level 30, IC wafer bonding oxide 32, active devices 34 and 36, contacts 38 and 40, interconnect metals 42, 44, 50, and 52, and vias 46 and 48.

Pre-metal dielectric 24 is situated over substrate 22. First metallization level 26, interlayer dielectric 28, second metallization level 30, and IC wafer bonding oxide 32 are sequentially situated over pre-metal dielectric 24. In various implementations, substrate 22 is a silicon (Si), germanium (Ge), silicon germanium ($Si_XGe_Y$), silicon carbide ($Si_XC_Y$), or group III-V substrate. In various implementations, pre-metal dielectric 24 can comprise borophosphosilicate glass (BPSG), tetra-ethyl ortho-silicate (TEOS), silicon onynitride ($Si_XO_YN_Z$), silicon oxide ($Si_XO_Y$), silicon nitride ($Si_XN_Y$), or another dielectric. In various implementations, interlayer dielectric 28 can comprise $Si_XO_Y$, $Si_XN_Y$, or another dielectric. Moreover, the dielectric in first metallization level 26 and the dielectric in second metallization level 30 can comprise $Si_XO_Y$, $Si_XN_Y$, or another dielectric between metal segments in each metallization level. In various implementations, IC wafer 16 can include more metallization levels and/or more interlayer dielectrics than those shown in FIG. 2.

Active devices 34 and 36 are situated in substrate 22. Contact 38 in pre-metal dielectric 24, interconnect metal 42 in first metallization level 26, via 46 in interlayer dielectric 28, and interconnect metal 50 in second metallization level 30 are electrically connected to active device 34. Contact 40 in pre-metal dielectric 24, interconnect metal 44 in first metallization level 26, via 48 in interlayer dielectric 28, and interconnect metal 52 in second metallization level 30 are electrically connected to active device 36. In various implementations, active devices 34 and 36 can be complementary metal oxide semiconductor (CMOS), bipolar CMOS (BiCMOS), SiGe, or group II-V devices. In various implementations, active devices 34 and 36 can be transistors, amplifiers, filters, mixers, or diodes.

In the present example, IC wafer bonding oxide 32 is formed over second or any other metallization level 30 on metallization side 20 of IC wafer 16. In various implementations, IC wafer bonding oxide 32 can be thermal $Si_XO_Y$ or plasma enhanced chemical vapor deposition (PECVD) $Si_XO_Y$. In one implementation, IC wafer bonding oxide 32 can have a thickness of approximately one half a micron to approximately two microns (0.5 µm-2 µm). In one implementation, after forming IC wafer bonding oxide 32, the surface of IC wafer bonding oxide 32 is treated using any method known in the art, such as a dry clean or wet clean, in order to improve a subsequent bonding action. In one implementation, the surface of IC wafer bonding oxide 32 is also de-ionized using any method known in the art in order to improve a subsequent bonding action.

Figure 3:
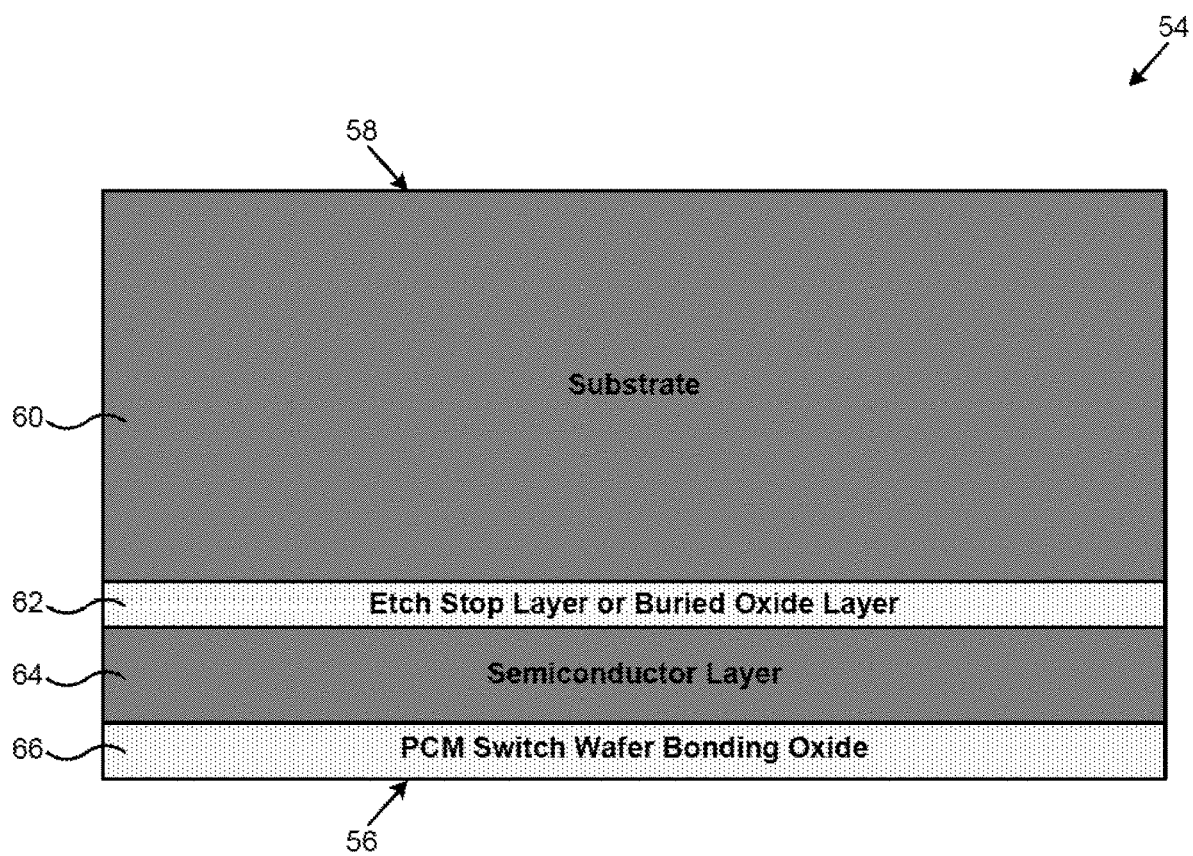
FIG. 3 illustrates a cross-sectional view of a portion of a structure processed in accordance with the flowchart of FIG. 1 according to one implementation of the present application.

Referring to FIG. 3, PCM switch wafer 54 illustrates a cross-sectional view of a portion of a structure processed in accordance with actions 4 and 6 in the flowchart of FIG. 1 according to one implementation of the present application. It is noted that FIG. 3 illustrates PCM switch wafer 54 in a flipped position. As shown in FIG. 3, PCM switch wafer 54 has RF terminal side 58 and heat spreading side 56. PCM switch wafer 54 also includes substrate 60, etch stop layer or buried oxide layer 62, semiconductor layer 64 (which performs as a heat spreader in a final bonded two-die device, as described below), and PCM switch wafer bonding oxide 66.

In one implementation, substrate 60, etch stop layer or buried oxide layer 62, and semiconductor layer 64 can be provided together as a pre-fabricated silicon-on-insulator (SOI) wafer. In this implementation, etch stop layer or buried oxide layer 62 is a buried oxide (BOX) layer of the SOI wafer. A bonded and etch back SOI (BESOI) process, a separation by implantation of oxygen (SIMOX) process, or a "smart cut" process can be used for fabricating the SOI wafer as known in the art. In a SIMOX process, substrate 60 can be bulk silicon.

In another implementation, substrate 60, etch stop layer or buried oxide layer 62, and semiconductor layer 64 are not an SOI wafer. In this implementation, etch stop layer or buried oxide layer 62 is an etch stop layer. For example, substrate 60 can be bulk silicon, etch stop layer 62 can be heavily doped (e.g., P++) epitaxial silicon formed on substrate 60, and semiconductor layer 64 can be epitaxial silicon formed on etch stop layer 62. As another example, substrate 60 and semiconductor layer 64 can be bulk silicon, and etch stop layer 62 can be an implant (e.g., P++ implant) in the bulk silicon.

Semiconductor layer 64 can be any semiconductor material having high thermal conductivity. For example, semiconductor layer 64 in FIG. 3 can be monocrystalline epitaxial silicon or monocrystalline bulk silicon, and its thermal conductivity can be approximately one hundred thirty watts per meter-kelvin (130 W/(m·K)). As described below, semiconductor layer 64 performs as a heat spreader in a final bonded two-die device. In one implementation, etch stop layer or buried oxide layer 62 is not used, and substrate 60 and semiconductor layer 64 are integrally formed as bulk silicon. In various implementations, substrate 60 and/or semiconductor layer are silicon (Si), germanium (Ge), silicon germanium ($Si_XGe_Y$), silicon carbide ($Si_XC_Y$), or group II-V material.

PCM switch wafer bonding oxide 66 is formed on semiconductor layer 64 on heat spreading side 56 of PCM switch wafer 54. In various implementations, PCM switch wafer bonding oxide 66 can be thermal $Si_XO_Y$ or PECVD $Si_XO_Y$. In one implementation, PCM switch wafer bonding oxide 66 can have a thickness of approximately ten angstroms to approximately one thousand angstroms (10 Å-1000 Å). In one implementation, after forming PCM switch wafer bonding oxide 66, the surface of PCM switch wafer bonding oxide 66 is treated using any method known in the art, such as a dry clean or wet clean, in order to improve a subsequent bonding action. In one implementation, the surface of PCM switch wafer bonding oxide 66 is also de-ionized using any method known in the art in order to improve a subsequent bonding action.

Figure 4:
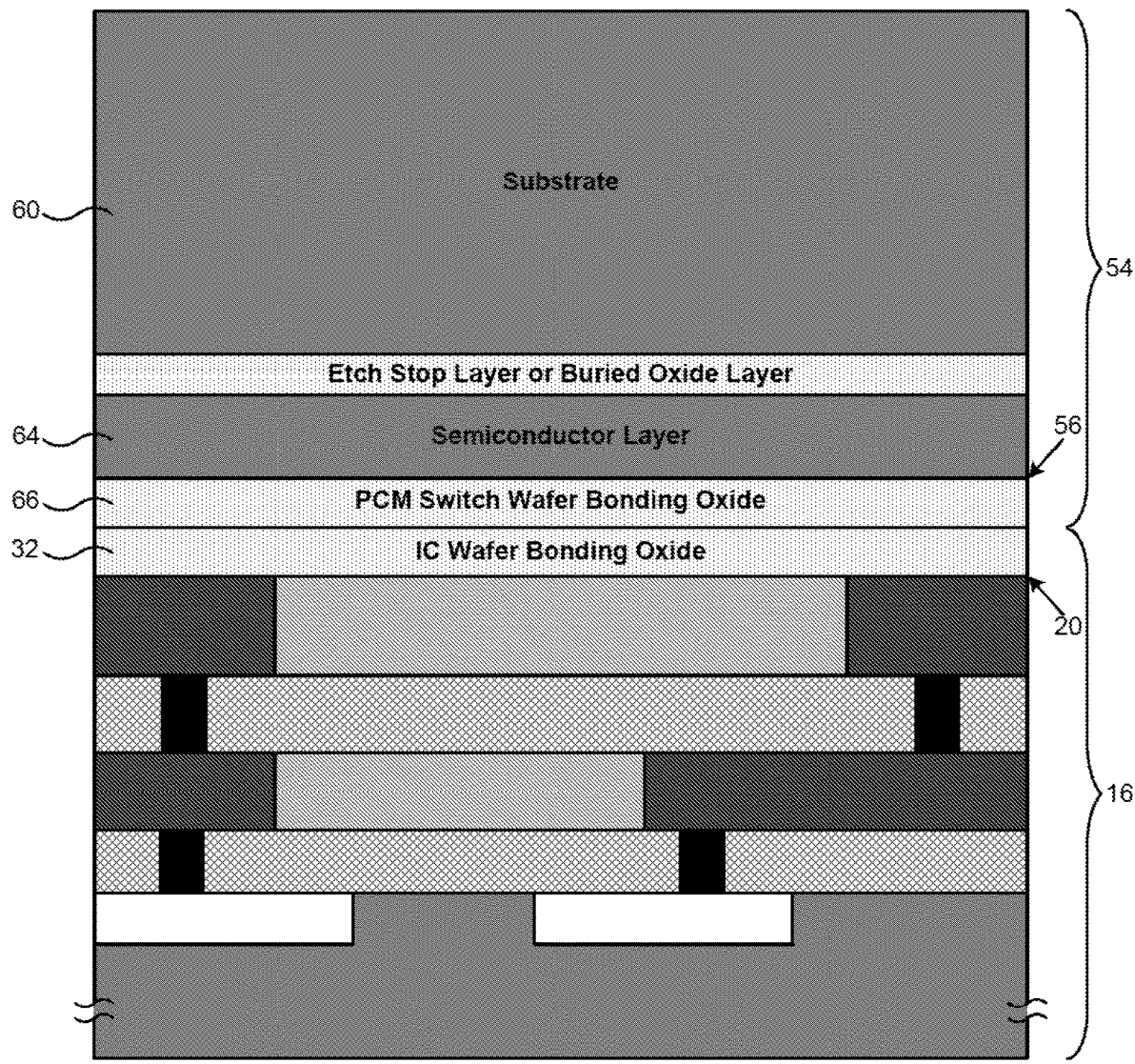
FIG. 4 illustrates a cross-sectional view of a portion of a bonded structure processed in accordance with the flowchart of FIG. 1 according to one implementation of the present application.

FIG. 4 illustrates a cross-sectional view of a portion of a bonded structure processed in accordance with action 8 in the flowchart of FIG. 1 according to one implementation of the present application. As shown in FIG. 4, heat spreading side 56 of PCM switch wafer 54 is bonded to metallization side 20 of IC wafer 16. PCM switch wafer bonding oxide 66 is situated on IC wafer bonding oxide 32. PCM switch wafer 54 and IC wafer 16 can be aligned using an optical front-to-back alignment process, an infrared alignment process, or any other alignment process. PCM switch wafer 54 and IC wafer 16 can be bonded using, for example, a fusion bonding process. Although the present implementation illustrates oxide-to-oxide bonding, in general, any bonding process may be used to bond heat spreading side 56 of PCM switch wafer 54 to metallization side 20 of IC wafer 16. In one implementation, either PCM switch wafer bonding oxide 66 or IC wafer bonding oxide 32 can be omitted. For example, PCM switch wafer bonding oxide 66 can be omitted, semiconductor layer 64 can be situated on IC wafer bonding oxide 32, and PCM switch wafer 54 and IC wafer can be bonded using an anodic bonding process. As another alternative, direct bonding of silicon to silicon, i.e. silicon fusion bonding, can be used in a manner known in the art, in which case PCM switch wafer bonding oxide 66 and IC wafer bonding oxide 32 are replaced by silicon layers.

Figure 5:
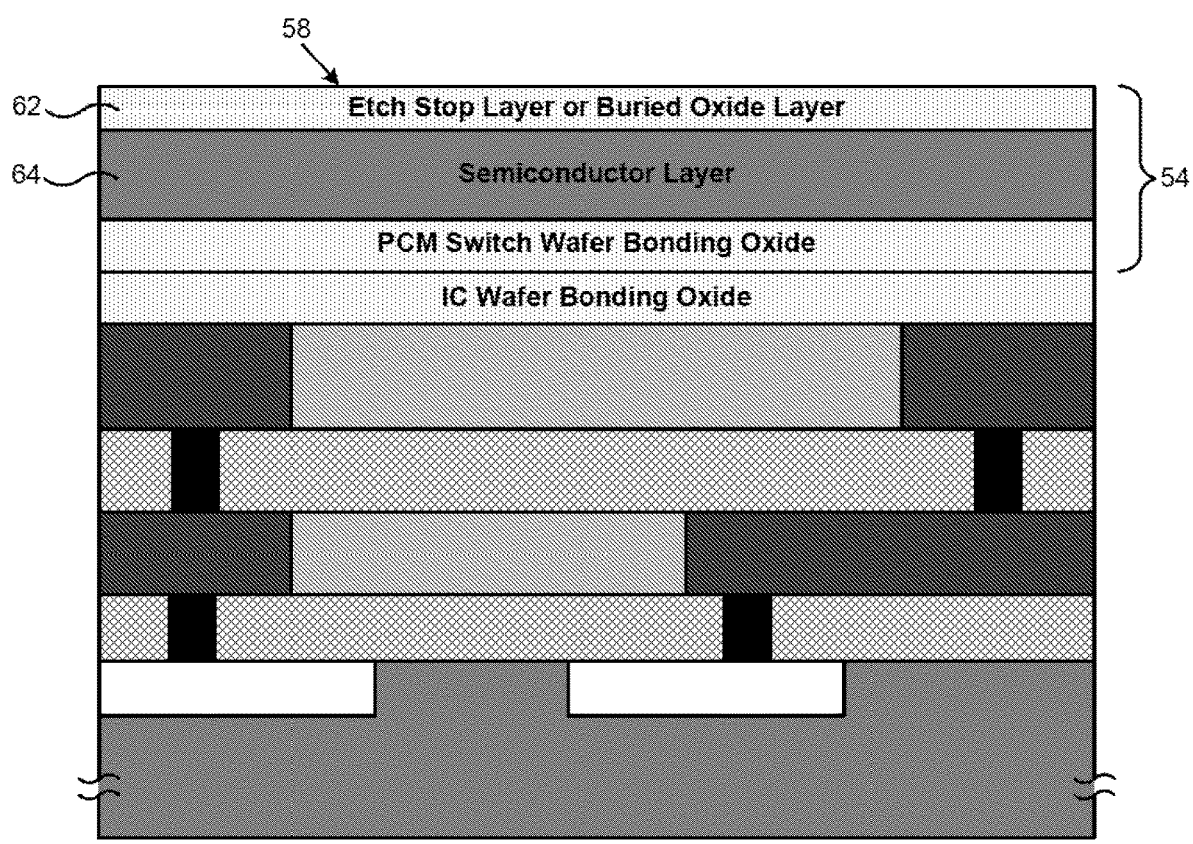
FIGS. 5 through 7 illustrate cross-sectional views of portions of a bonded structure processed in accordance with the flowchart of FIG. 1 according to one implementation of the present application.
Figure 6:
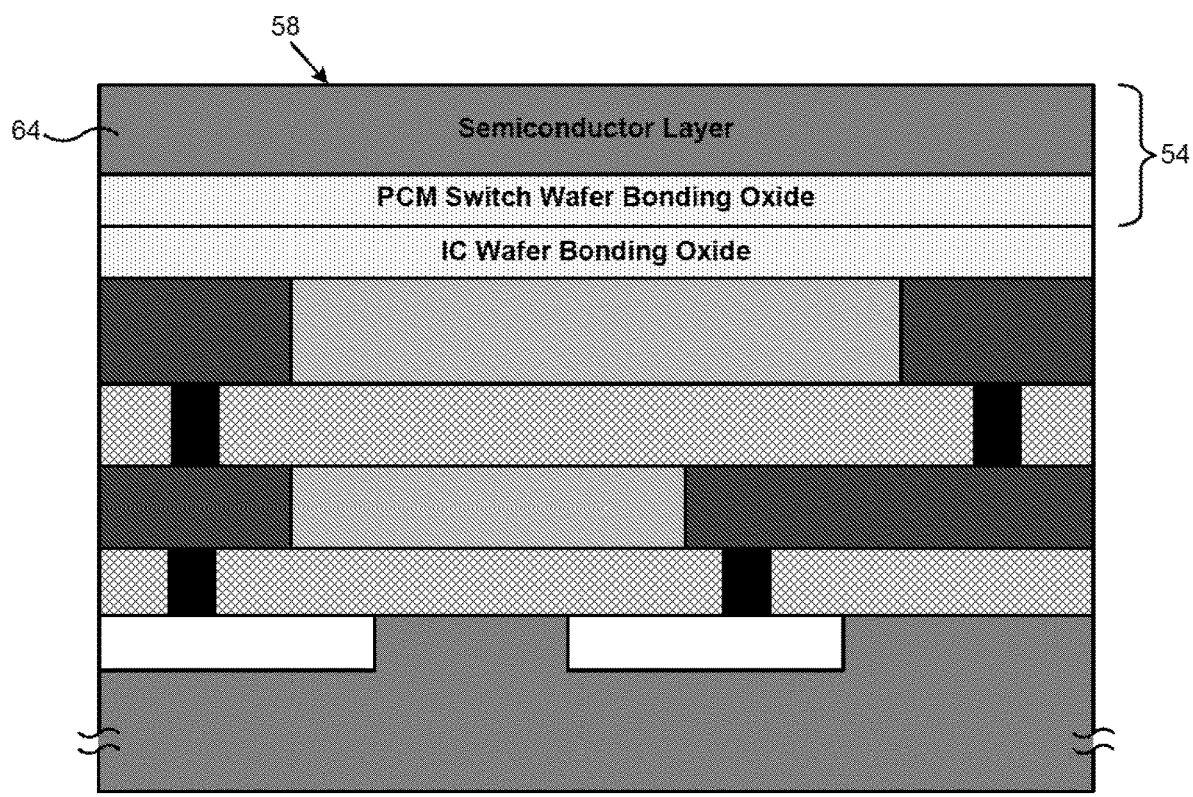
Figure 7:
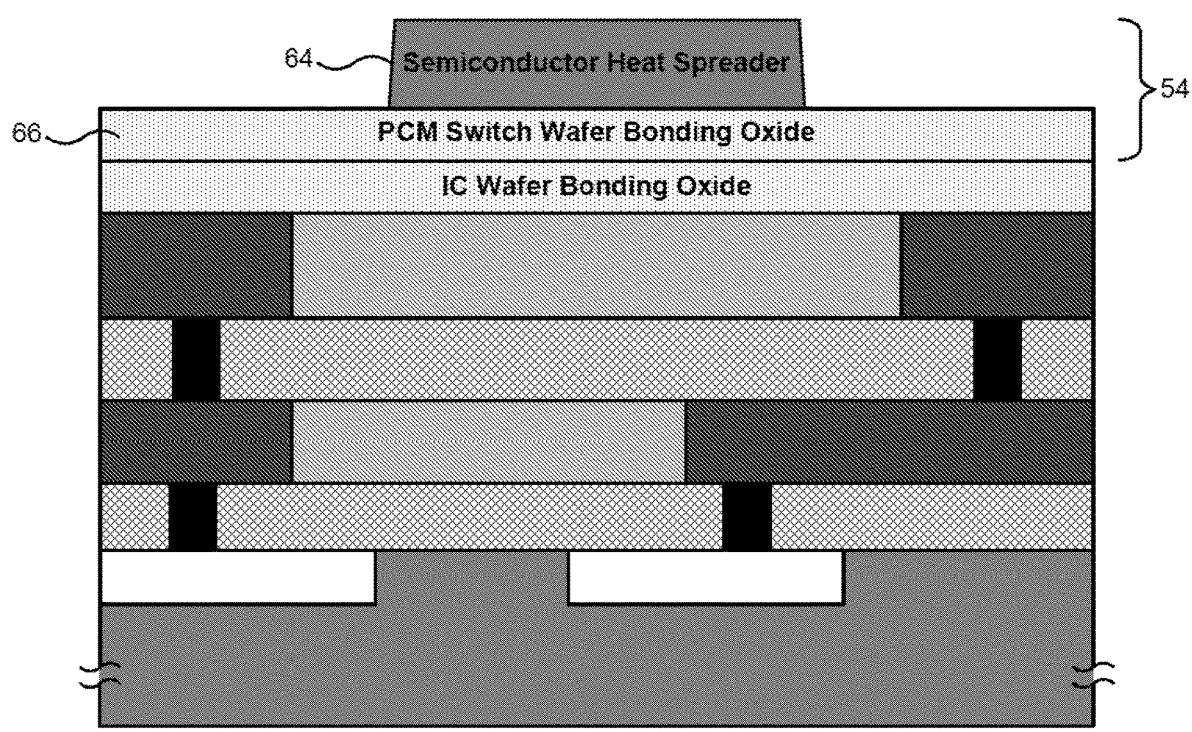

FIGS. 5 through 7 illustrate cross-sectional views of portions of a bonded structure processed in accordance with action 10 in the flowchart of FIG. 1 according to one implementation of the present application. As shown in FIG. 5, substrate 60 (shown in FIG. 4) is removed from RF terminal side 58 of PCM switch wafer 54. In one implementation, substrate 60 (shown in FIG. 4) is removed using two actions. In the first action, a grinding process can be used to remove a large portion of substrate 60 (shown in FIG. 4). In the second action, an etching process can be used to remove a remaining portion of substrate 60 (shown in FIG. 4). The etching process can etch to and stop at etch stop layer or buried oxide layer 62 using a selective etch. Substrate 60 (shown in FIG. 4) can be aggressively etched without etching semiconductor layer 64. As a result, semiconductor layer 64 (which performs as a heat spreader in a final bonded two-die device, as described below) will maintain its thickness, and the reliability of the final bonded two-die device is improved.

As shown in FIG. 6, etch stop layer or buried oxide layer 62 (shown in FIG. 5) is removed from RF terminal side 58 of PCM switch wafer 54, leaving semiconductor layer 64. Where etch stop layer or buried oxide layer 62 (shown in FIG. 5) is a heavily doped (e.g., P++) epitaxial silicon, it can be removed, for example, using a chemical dry etch. Where etch stop layer or buried oxide layer 62 (shown in FIG. 5) is a BOX layer, it can be removed, for example, using a chemical wet etch. As shown in FIG. 7, semiconductor layer 64 is patterned. In PCM switch wafer 54, a portion of semiconductor layer 64 remains on PCM switch wafer bonding oxide 66. Because semiconductor layer 64 performs as a heat spreader in a final bonded two-die device, it will also be referred to as semiconductor heat spreader 64 in the present application. As shown in FIG. 7, action 10 of the flowchart of FIG. 1 results in patterning semiconductor heat spreader 64 in PCM switch wafer 54.

Figure 8:
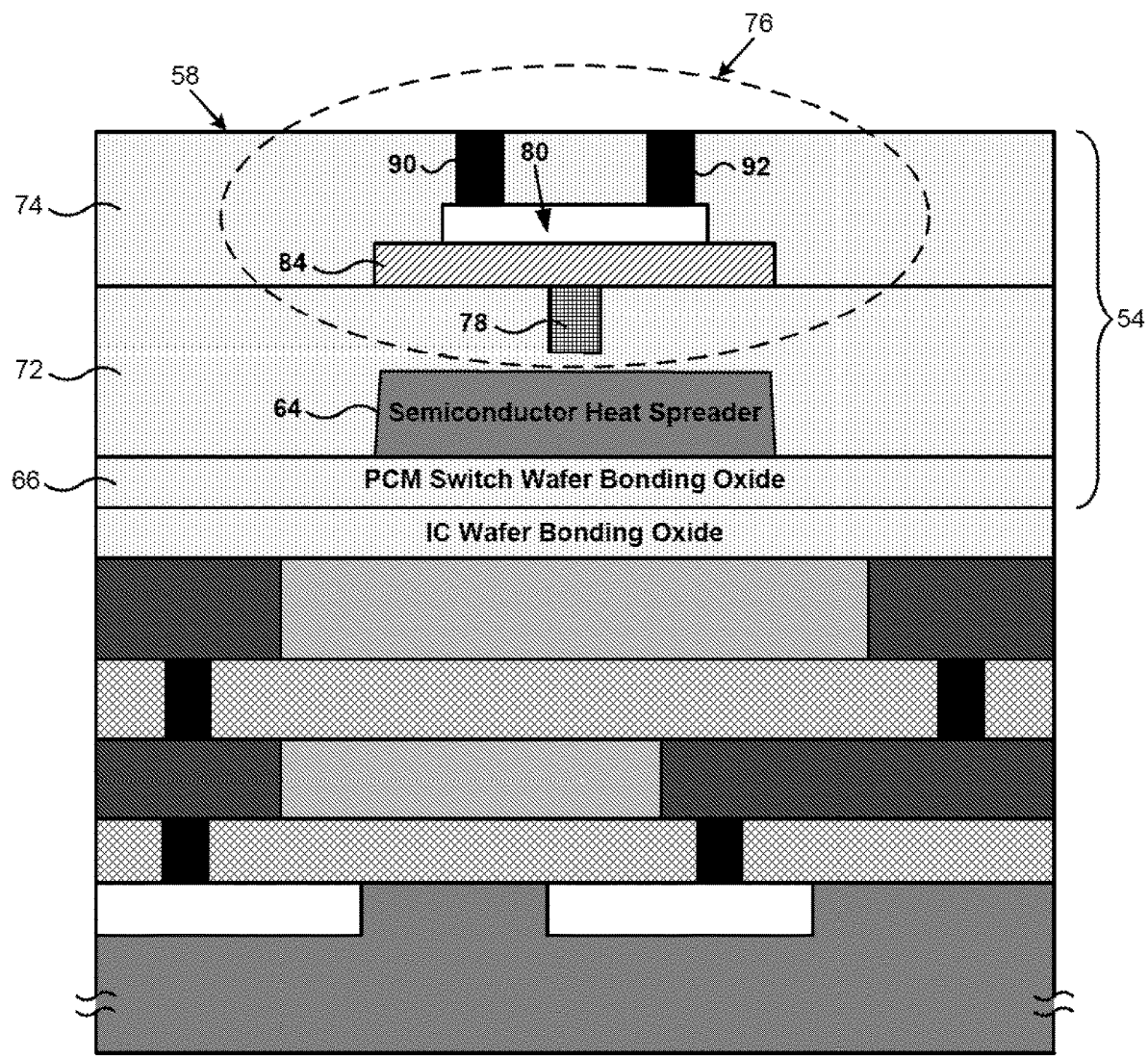
FIG. 8 illustrates a cross-sectional view of a portion of a bonded structure processed in accordance with the flowchart of FIG. 1 according to one implementation of the present application.

FIG. 8 illustrates a cross-sectional view of a portion of a bonded structure processed in accordance with action 12 in the flowchart of FIG. 1 according to one implementation of the present application. As shown in FIG. 8, PCM RF switch 76, including heating element 78 and PCM 80, is formed in PCM switch wafer 54. Lower dielectric 72 and contact dielectric 74 are formed on semiconductor heat spreader 64 and PCM switch wafer bonding oxide 66. Heating element 78 of PCM RF switch 76 is formed in lower dielectric 72, between semiconductor heat spreader 64 and PCM 80. Thermally conductive and electrically insulating material 84 of PCM RF switch 76 is formed in contact dielectric 74 between heating element 78 and PCM 80. RF terminals 90 and 92 are formed at RF terminal side 58 of PCM switch wafer 54, in contact dielectric 74, and connected to PCM 80. In various implementations, contact dielectric 74 is silicon dioxide ($SiO_2$), boron-doped $SiO_2$, phosphorous-doped $SiO_2$, $Si_XN_Y$, or another dielectric. In various implementations, contact dielectric 74 is a low-k dielectric, such as fluorinated silicon dioxide, carbon-doped silicon oxide, or spin-on organic polymer. Contact dielectric 74 can be provided, for example, by PECVD, high density plasma CVD (HDP-CVD), or spin-on processes. Additional details regarding PCM RF switch 76 are described below.

Figure 9:
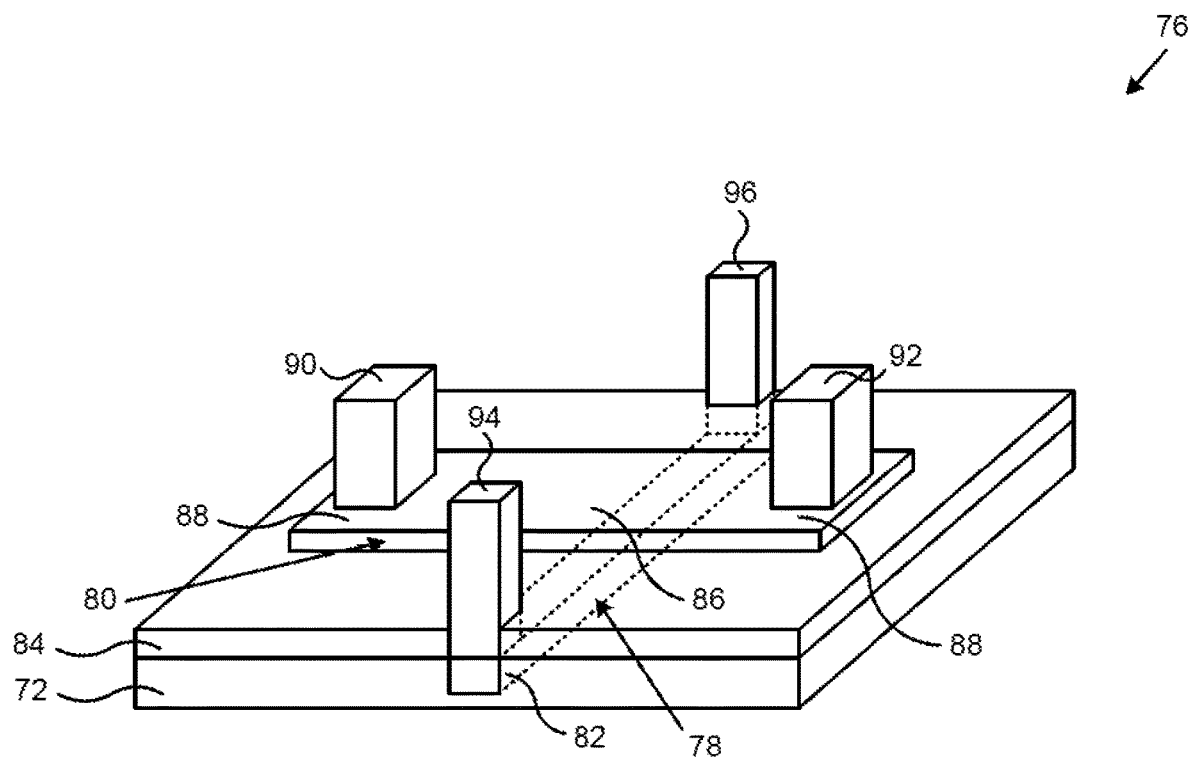
FIG. 9 illustrates a perspective view of a portion of a PCM RF switch according to one implementation of the present application.

FIG. 9 illustrates a perspective view of a portion of a PCM RF switch according to one implementation of the present application. PCM RF switch 76 in FIG. 9 generally corresponds to PCM RF switch 76 in FIG. 8. As shown in FIG. 9, PCM RF switch 76 includes lower dielectric 72, heating element 78 having terminal segments 82, thermally conductive and electrically insulating material 84, PCM 80 having active segment 86 and passive segments 88, RF terminals 90 and 92, and heater terminals 94 and 96. For purposes of illustration, the perspective view in FIG. 9 shows selected structures of PCM RF switch 76. PCM RF switch 76 may include other structures not shown in FIG. 9.

Lower dielectric 72 in PCM RF switch 76 is situated below thermally conductive and electrically insulating material 84. As shown in FIG. 9, lower dielectric 72 is also adjacent to sides of heating element 78. Lower dielectric 72 extends along the width of PCM RF switch 76, and is also coplanar with the top of heating element 78. Because PCM RF switch 76 includes lower dielectric 72 on the sides of heating element 78, less heat transfers horizontally (i.e., from the sides) and more heat dissipates vertically, from heating element 78 toward active segment 86 of PCM 80. In various implementations, lower dielectric 72 can have a relative width and/or a relative thickness greater or less than shown in FIG. 9. Lower dielectric 72 can comprise any material with thermal conductivity lower than that of thermally conductive and electrically insulating material 84. In various implementations, lower dielectric 72 can comprise $Si_xO_y$, $Si_xN_y$, or another dielectric.

Heating element 78 in PCM RF switch 76 is situated in lower dielectric 72. Heating element 78 also underlies active segment 86 of PCM 80. Heating element 78 generates a crystallizing heat pulse or an amorphizing heat pulse for transforming active segment 86 of PCM 80. Heating element 78 can comprise any material capable of Joule heating. Heating element 78 can be connected to electrodes of a pulse generator (not shown in FIG. 9) that generates crystallizing or amorphizing voltage or current pulses. Preferably, heating element 78 comprises a material that exhibits minimal or substantially no electromigration, thermal stress migration, and/or agglomeration. In various implementations, heating element 78 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 78 comprises tungsten lined with titanium and titanium nitride.

Thermally conductive and electrically insulating material 84 in PCM RF switch 76 is situated on top of heating element 78 and lower dielectric 72, and under PCM 80 and, in particular, under active segment 86 of PCM 80. Thermally conductive and electrically insulating material 84 ensures efficient heat transfer from heating element 78 toward active segment 86 of PCM 80, while electrically insulating heating element 78 from RF terminals 90 and 92, PCM 80, and other neighboring structures.

Thermally conductive and electrically insulating material 84 can comprise any material with high thermal conductivity and high electrical resistivity. In various implementations, thermally conductive and electrically insulating material 84 can comprise silicon carbide ($Si_xC_y$), aluminum nitride ($Al_xN_y$), aluminum oxide ($Al_xO_y$), beryllium oxide ($Be_xO_y$), diamond, or diamond-like carbon. In one implementation, thermally conductive and electrically insulating material 84 can be a nugget that does not extend along the width of PCM RF switch 76. For example, thermally conductive and electrically insulating material 84 can be a nugget approximately aligned with heating element 78.

PCM 80 in PCM RF switch 76 is situated on top of thermally conductive and electrically insulating material 84. PCM 80 includes active segment 86 and passive segments 88. Active segment 86 of PCM 80 is approximately aligned with heating element 78 and is approximately defined by heating element 78. Passive segments 88 of PCM 80 extend outward and are transverse to heating element 78, and are situated approximately under RF terminals 90 and 92. As used herein, "active segment" refers to a segment of PCM that transforms between crystalline and amorphous phases, for example, in response to a crystallizing or an amorphizing heat pulse generated by heating element 78, whereas "passive segment" refers to a segment of PCM that does not make such transformation and maintains a crystalline phase (i.e., maintains a conductive state).

With proper heat pulses and heat dissipation, active segment 86 of PCM 80 can transform between crystalline and amorphous phases, allowing PCM RF switch 76 to switch between ON and OFF states respectively. Active segment 86 of PCM 80 must be heated and rapidly quenched in order for PCM RF switch 76 to switch states. If active segment 86 of PCM 80 does not quench rapidly enough, it will not transform and PCM RF switch 76 will fail to switch states. How rapidly active segment 86 of PCM 80 must be quenched depends on the material, volume, and temperature of PCM 80. In one implementation, the quench time window can be approximately one hundred nanoseconds (100 ns) or greater or less.

PCM 80 can comprise germanium telluride ($Ge_xTe_y$), germanium antimony telluride ($Ge_xSb_yTe_z$), germanium selenide ($Ge_xSe_y$), or any other chalcogenide. In various implementations, PCM 80 can be germanium telluride having from forty percent to sixty percent germanium by composition (i.e., $Ge_xTe_y$, where $0.4 \leq X \leq 0.6$ and $Y=1-X$). The material for PCM 80 can be chosen based upon ON state resistivity, OFF state electric field breakdown voltage, crystallization temperature, melting temperature, or other considerations. It is noted that in FIG. 9, heating element 78 extends outwards and is transverse to PCM 80. Heating element 78 is illustrated with dashed lines as seen through various structures of PCM RF switch 76. Current flowing in heating element 78 flows substantially under active segment 86 of PCM 80.

RF terminals 90 and 92 in PCM RF switch 76 are connected to passive segments 88 of PCM 80. Similarly, heater terminals 94 and 96 are connected to terminal segments 82 of heating element 78. RF terminals 90 and 92 provide RF signals to and from PCM 80. Heater terminals 94 and 96 provide power to heating element 78 for generating a crystallizing heat pulse or an amorphizing heat pulse. RF terminals 90 and 92 and heater terminals 94 and 96 can extend through various interlayer metal levels (not shown in FIG. 9). In various implementations, RF terminals 90 and 92 and heater terminals 94 and 96 can comprise tungsten (W), copper (Cu), or aluminum (Al).

Figure 10:
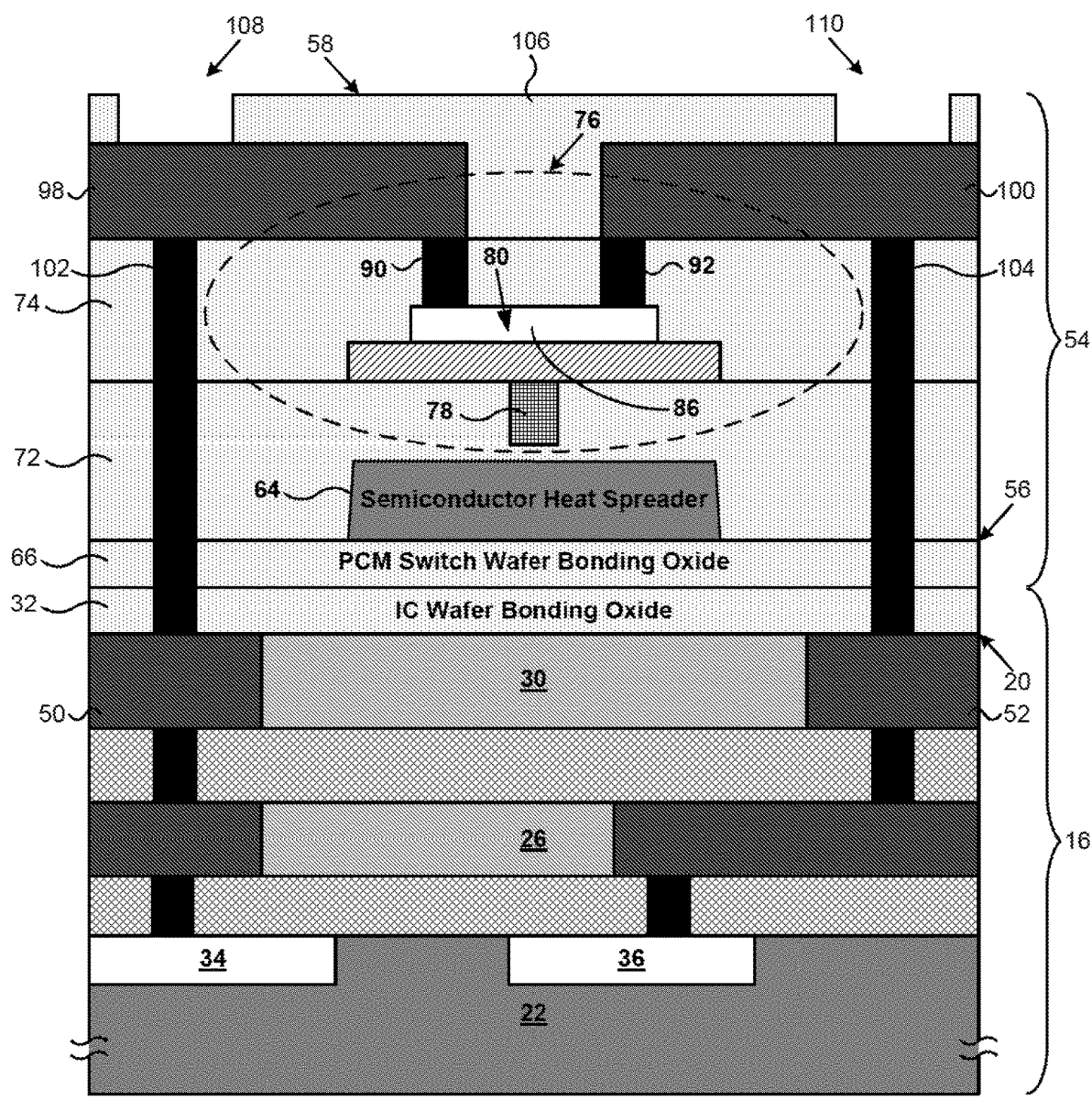
FIG. 10 illustrates a cross-sectional view of a portion of a bonded structure processed in accordance with the flowchart of FIG. 1 according to one implementation of the present application.

FIG. 10 illustrates a cross-sectional view of a portion of a bonded structure processed in accordance with action 14 in the flowchart of FIG. 1 according to one implementation of the present application. As shown in FIG. 10, RF terminals 90 and 92 in PCM RF switch 76 of PCM switch wafer 54 are electrically connected to active devices 34 and 36, respectively, in substrate 22 of IC wafer 16. Interconnect metals 98 and 100 are situated on contact dielectric 74 and connected to RF terminals 90 and 92 respectively. Vias 102 and 104 extend through contact dielectric 74, lower dielectric 72, PCM switch wafer bonding oxide 66, and IC wafer bonding oxide 32. Via 102 connects interconnect metal 98 in PCM switch wafer 54 to interconnect metal 50 in IC wafer 16. Via 104 connects interconnect metal 100 in PCM switch wafer 54 to interconnect metal 52 in IC wafer 16. PCM switch wafer 54 can be electrically connected to more or fewer active devices in IC wafer 16 than shown in FIG. 10, and can be connected using more or fewer interconnect metals and/or vias.

Upper dielectric 106 is formed on interconnect metals 98 and 100 at RF terminal side 58 of PCM switch wafer 54. In various implementations, upper dielectric 106 can comprise $Si_xO_Y$, $Si_xN_Y$, or another dielectric. Pad openings 108 and 110 are formed in upper dielectric 106 on interconnect metals 98 and 100 respectively. Pad openings 108 and 110 provide external connections for the bonded structure of FIG. 10. The bonded structure of FIG. 10 can have more or fewer pad openings than shown in FIG. 10.

The bonded structure of FIG. 10 manufactured according to the flowchart of FIG. 1 provides several advantages. First, methods according to the present application enable forming semiconductor heat spreader 64 from monocrystalline epitaxial semiconductor layers and monocrystalline bulk semiconductor layers in a bonded structure. In a conventional monolithic approach, temperature constraints can prohibit forming a heat spreader from an epitaxial semiconductor layer. Forming an epitaxial semiconductor layer can use high-temperature processes that reach approximately one thousand degrees Celsius (1000° C.) or more. Using these high-temperature processes to form an epitaxial semiconductor layer on IC wafer 16 can damage metallization structures formed in first metallization level 26 and second metallization level 30. In a conventional monolithic approach, a heat spreader formed on IC wafer 16 may need to be formed from polycrystalline silicon (polySi), or other materials, such as $Al_xN_Y$. Because the methods of the present application form semiconductor heat spreader 64 in PCM switch wafer 54, and then bond heat spreading side 56 of PCM switch wafer 54 to metallization side 20 of IC wafer 16, semiconductor heat spreader 64 can comprise monocrystalline semiconductor layers without damaging metallization structures formed in first metallization level 26 and second metallization level 30.

Semiconductor heat spreader 64 comprising monocrystalline semiconductor layers is particularly advantageous because heat generally transfers faster in monocrystalline materials. For example, a heat spreader comprising $Al_xN_Y$ can have thermal conductivity ranging from approximately thirty five watts per meter-kelvin to approximately fifty watts per meter-kelvin (35 W/(m·K)-120 W/(m·K)). In contrast, in one implementation, semiconductor heat spreader 64 in FIG. 10 can be monocrystalline Si, and its thermal conductivity can be approximately one hundred thirty watts per meter-kelvin (130 W/(m·K)). Semiconductor heat spreader 64 on heat spreading side 56 of PCM switch wafer 54 effectively dissipates heat generated by heating element 78 of PCM RF switch 76. Thus, active segment 86 of PCM 80 can rapidly quench and successfully transform phases, and PCM RF switch 76 can switch states with improved reliability.

Semiconductor heat spreader 64 comprising monocrystalline semiconductor layers also improves the reliability of the bonded structure of FIG. 10. For example, due to normal process variations, the thermal conductivity of $Al_xN_Y$ can vary significantly when formed on different wafers. In contrast, monocrystalline Si can be consistently formed with the same thermal conductivity across different wafers. $Al_xN_Y$ also exhibits relatively high stresses, which can deform structures in a bonded two-die device. Further, it can also be difficult to form thick $Al_xN_Y$. Semiconductor heat spreader 64 in FIG. 10 can readily be made thicker, and the larger mass can dissipate heat more efficiently. Where etch stop layer or buried oxide layer 62 (shown in FIG. 5) is also used, the thickness of semiconductor heat spreader 64 can be reliably controlled.

The bonded structure of FIG. 10 also efficiently integrates PCM RF switch 76 and active devices 34 and 36. Only one bonding step is used, thereby decreasing chances for alignment errors. Because PCM switch wafer bonding oxide 66 is bonded to IC wafer bonding oxide 32 in a planar fashion, the bonded structure in FIG. 10 is less likely to break in response to stresses. This planar bonding is also advantageous over other conventional bonding techniques, such as bump bonding, because bump bonds generally occupy a large volume and reduce the RF performance of PCM RF switch. Where RF terminals 90 and 92 of PCM RF switch 76 are electrically connected to active devices 34 and 36, PCM RF switch 76 generally exhibits improved performance as a result of integration.

Figure 11:
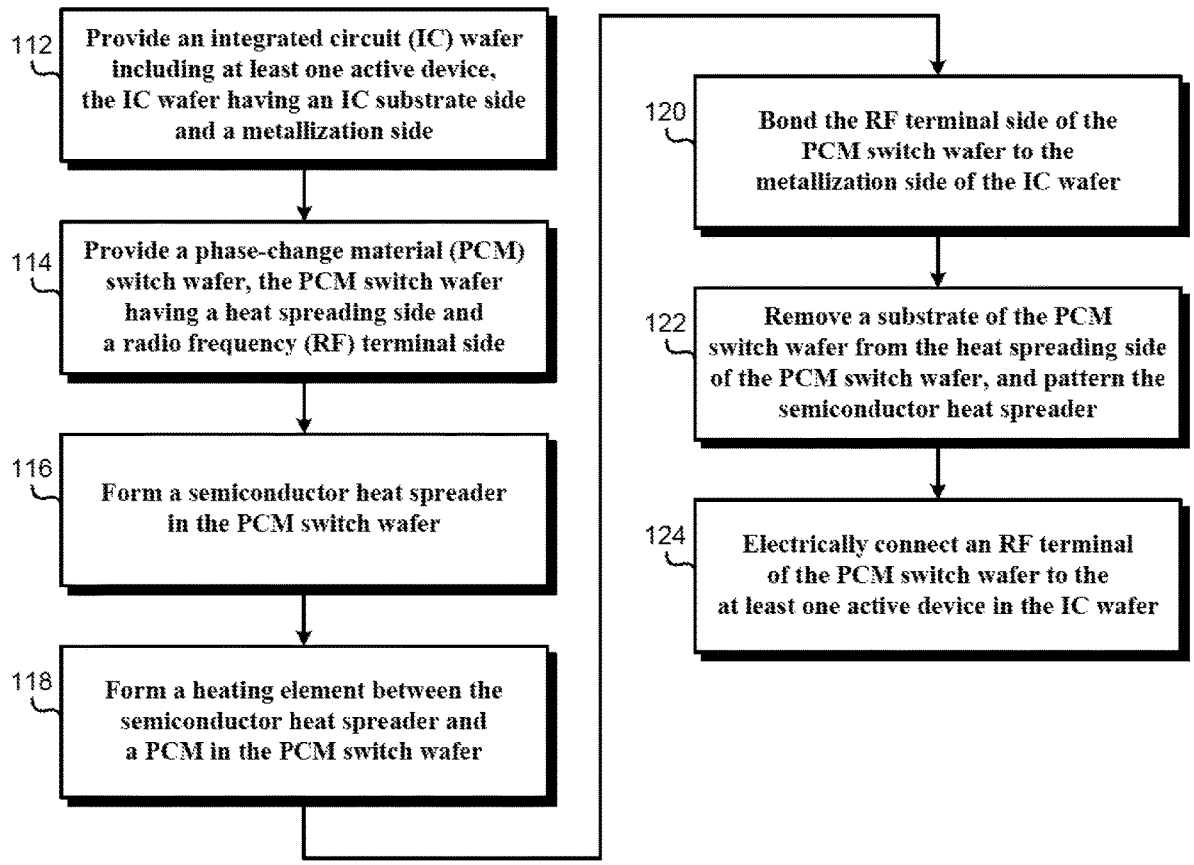
FIG. 11 illustrates a portion of a flowchart of an exemplary method for manufacturing a bonded structure including a PCM switch wafer and an IC wafer according to one implementation of the present application.

FIG. 11 illustrates a portion of a flowchart of an exemplary method for manufacturing a bonded structure including a PCM switch wafer and an IC wafer according to one implementation of the present application. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions. Actions 112 through 124 shown in the flowchart of FIG. 11 are sufficient to describe one implementation of the present inventive concepts. Other implementations of the present inventive concepts may utilize actions different from those shown in the flowchart of FIG. 11. Moreover, FIGS. 12 through 17 illustrate structures processed in accordance with the flowchart of FIG. 11. Referring to action 112, an IC wafer including at least one active device, and having an IC substrate side and a metallization side, can be provided as described above with reference to FIG. 2.

Figure 12:
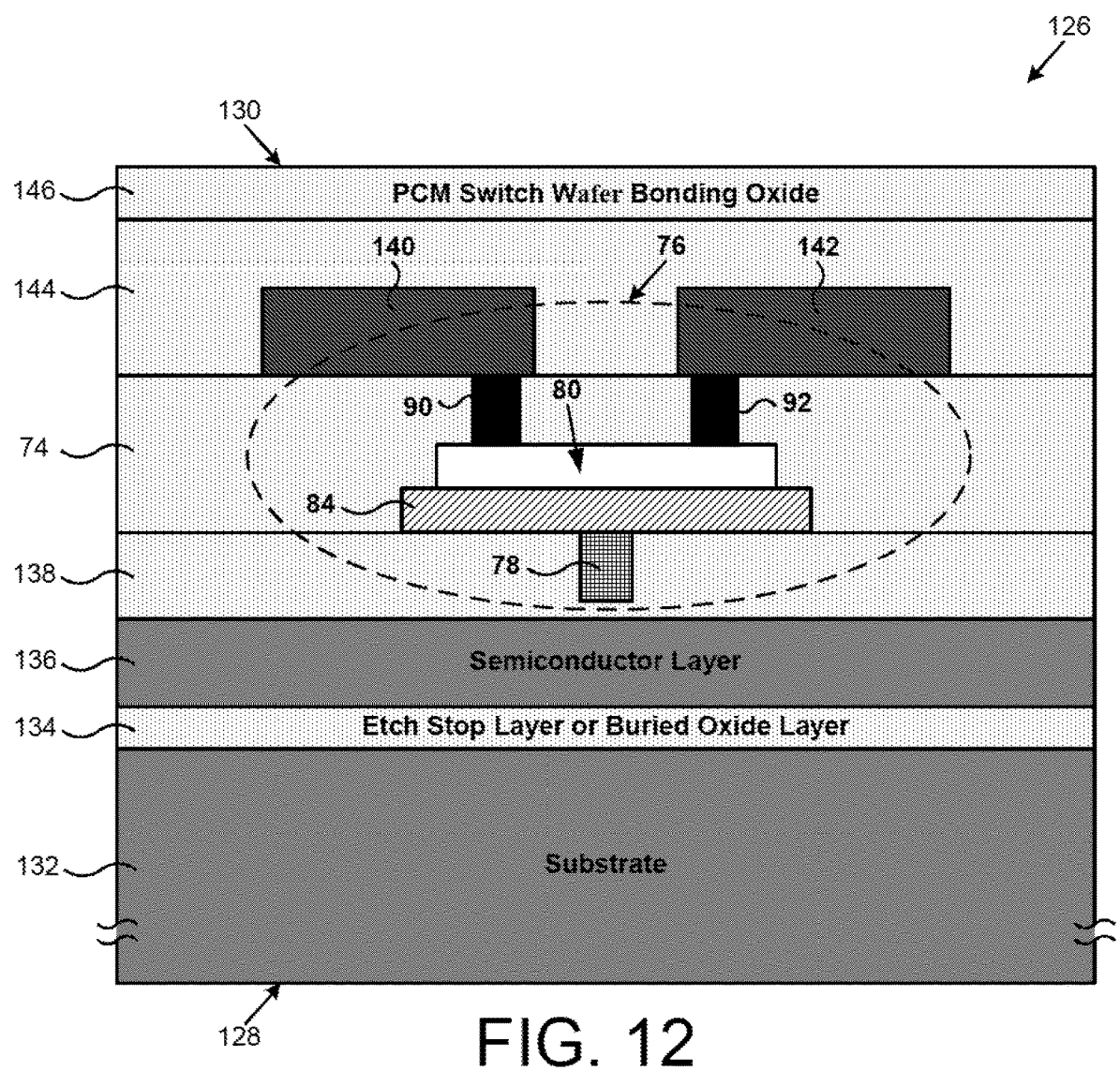
FIG. 12 illustrates a cross-sectional view of a portion of a structure processed in accordance with the flowchart of FIG. 11 according to one implementation of the present application.

Referring to FIG. 12, PCM switch wafer 126 illustrates a cross-sectional view of a portion of a device processed in accordance with actions 114, 116, and 118 in the flowchart of FIG. 11 according to one implementation of the present application. As shown in FIG. 12, PCM switch wafer 126 has heat spreading side 128 and RF terminal side 130. PCM switch wafer 126 includes substrate 132, etch stop layer or buried oxide layer 134, semiconductor layer 136 (which performs as a heat spreader in a final bonded two-die device, as described below), lower dielectric 138, contact dielectric 74, PCM RF switch 76, interconnect metals 140 and 142, interconnect dielectric 144, and PCM switch wafer bonding oxide 146. PCM RF switch 76 includes heating element 78, thermally conductive and electrically insulating material 84, PCM 80, and RF terminals 90 and 92.

Substrate 132, etch stop layer or buried oxide layer 134, and semiconductor layer 136 in FIG. 12 generally correspond to substrate 60, etch stop layer or buried oxide layer 62, and semiconductor layer in FIG. 3, and may have any implementations and advantages described above. For example, etch stop layer or buried oxide layer 134 may be a buried oxide (BOX) layer of an SOI wafer. Alternatively, etch stop layer or buried oxide layer 134 may be heavily doped (e.g., P++) epitaxial silicon. Moreover, semiconductor layer 136 may be monocrystalline epitaxial silicon or monocrystalline bulk silicon. Semiconductor layer 136 has high thermal conductivity and performs as a heat spreader in a final bonded two-die device. As an alternative to using an SOI wafer, a bulk silicon wafer could be bonded, and coarse ground to a desired thickness after wafer bonding. The ground surface can be finished by fine grinding and/or a CMP (chemical mechanical polish) action, although thickness variation in this approach may be more than thickness variation when using an SOI wafer. Alternatively, after coarse grinding, a wet etch can be used for surface smoothing and removing sub-surface damage. It is desirable for the semiconductor surface to be flat and free of defects with good crystal structure to allow for an improved heat-spreading function.

In yet another implementation, a thin silicon layer on a carrier substrate is utilized, where the carrier substrate can be, as examples, glass, fused silica, quartz, ceramics, polymeric plastic-like materials or hard plastics. The thin silicon layer or other heat spreader material can be attached to these carriers by a polyimide, BCB (Bisbenzocyclotene), spin on polymers, or special polymers or glues. After bonding of the thin silicon layer with the IC wafer, these carrier substrates can be removed by heat, plasma, laser, appropriate chemicals in liquid or vapor form, and/or other methods known in the art such as lift-off (involving cracking the wafer edge and lift-off in combination with applied heat). In these implementations, the thin silicon layer or other heat spreader material can be transferred to the IC wafer. After completion of all process steps, the bonded devices are singulated and packaged as final products.

Moreover, if a die-to-wafer bonding (instead of a wafer-to-wafer bonding) approach is utilized, the PCM switch dies are picked-and-placed onto the IC wafer, bonded and post-processed to complete the bonded devices which are then singulated and packaged as final products. In the die-to-wafer bonding approach it is possible to grind the PCM switch die on the IC wafer to a thickness similar to the wafer-to-wafer approach, but the die-to-wafer approach may require adding oxide or other dielectrics to fill gaps between the dies attached to the IC wafer, and also to add stability to the dies and their bonds to the wafer, prior to grinding.

In contrast to PCM switch wafer 54 in FIG. 3, where PCM switch wafer bonding oxide 66 is formed on semiconductor layer 64 at heat spreading side 56, PCM switch wafer 126 in FIG. 12 includes PCM RF switch 76 formed on semiconductor layer 136. PCM switch wafer bonding oxide 146 is formed on interconnect dielectric 144 at RF terminal side 130. PCM RF switch 76, including heating element 78 and PCM 80, is formed in lower dielectric 138 and contact dielectric 74. PCM RF switch 76, lower dielectric 138, and contact dielectric 74 in FIG. 12 may have any implementations and advantages described above. Notably in FIG. 12, PCM RF switch 76 is formed prior to a bonding action.

Interconnect metals 140 and 142 are formed on RF terminals 90 and 92, respectively, of PCM RF switch 76 and on contact dielectric 74. Interconnect dielectric 144 is formed on interconnect metals 140 and 142. PCM switch wafer bonding oxide 146 is formed on interconnect dielectric 144 on RF terminal side 130 of PCM switch wafer 126. PCM switch wafer bonding oxide 146 in FIG. 12 may have any implementations and advantages described above. For example, PCM switch wafer bonding oxide 146 may be thermal $Si_XO_Y$ or PECVD $Si_XO_Y$, and may be treated and/or de-ionized in order to improve a subsequent bonding action.

Figure 13:
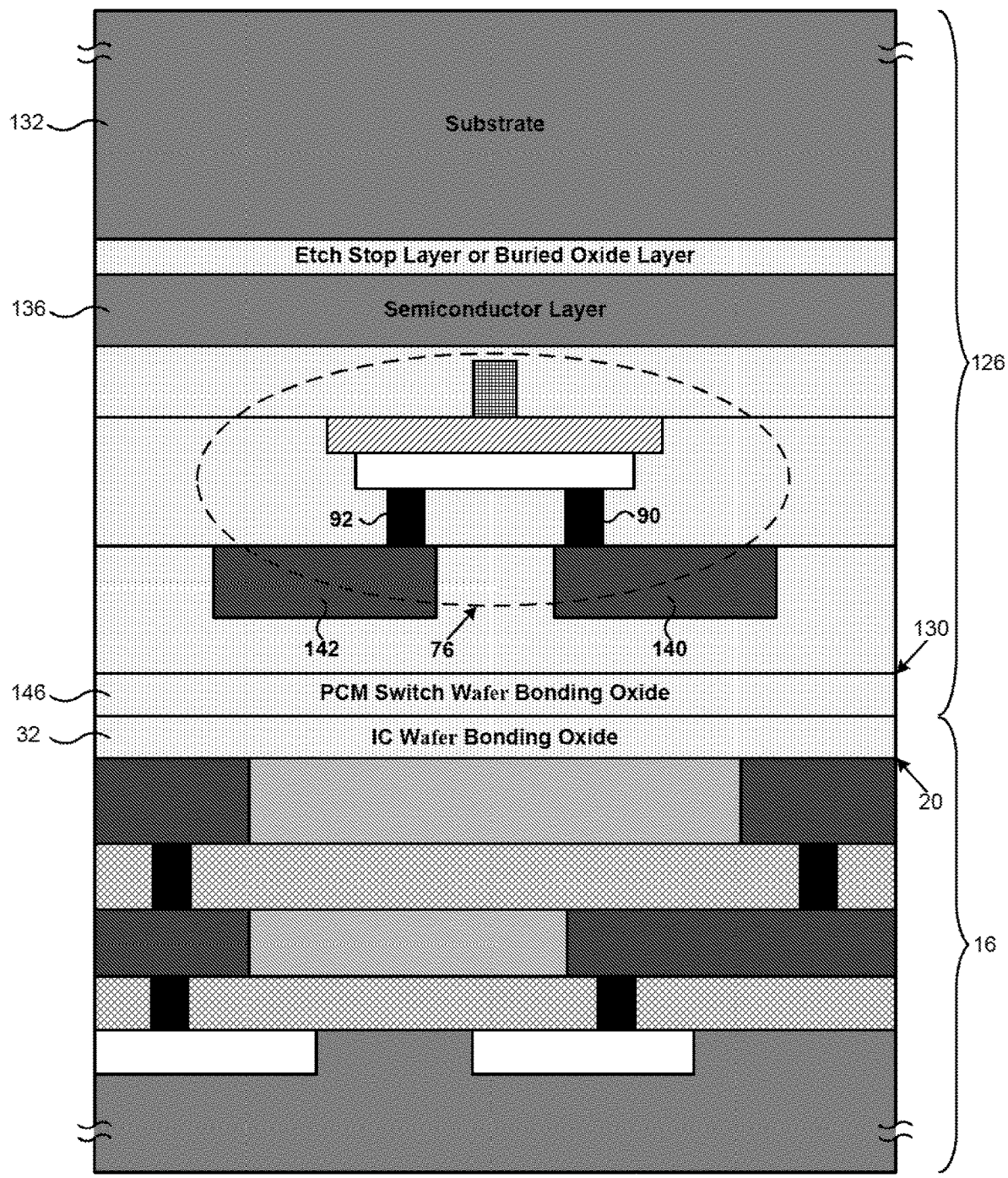
FIG. 13 illustrates a cross-sectional view of a portion of a bonded structure processed in accordance with the flowchart of FIG. 11 according to one implementation of the present application.

FIG. 13 illustrates a cross-sectional view of a portion of a bonded structure processed in accordance with action 120 in the flowchart of FIG. 11 according to one implementation of the present application. As shown in FIG. 13, RF terminal side 130 of PCM switch wafer 126 is bonded to metallization side 20 of IC wafer 16. PCM switch wafer bonding oxide 146 is situated on IC wafer bonding oxide 32. PCM switch wafer 126 and IC wafer 16 can be aligned using an optical front-to-back alignment process, an infrared alignment process, or any other alignment process. PCM switch wafer 126 and IC wafer 16 can be bonded using, for example, a fusion bonding process. In contrast to PCM switch wafer 54 in FIG. 4, where semiconductor layer 64 is situated near PCM switch wafer bonding oxide 66, PCM switch wafer 126 in FIG. 13 includes RF terminal 90 and 92 of PCM RF switch 76 and corresponding interconnect metals 140 and 142 situated near PCM switch bonding oxide 146. Semiconductor layer 136 is situated farther from PCM switch bonding oxide 146.

Figure 14:
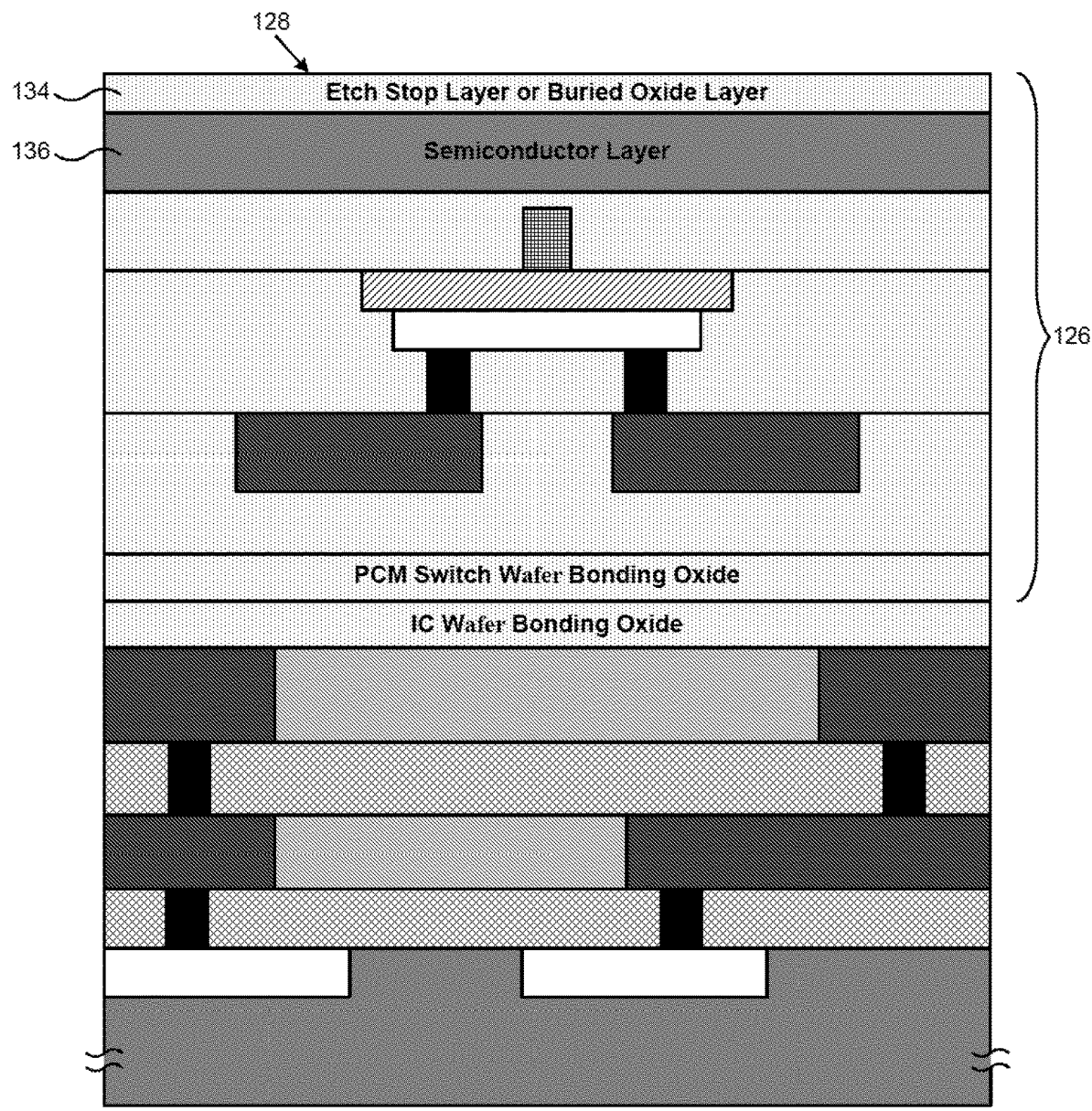
FIGS. 14 through 16 illustrate cross-sectional views of portions of a bonded structure processed in accordance with the flowchart of FIG. 11 according to one implementation of the present application.
Figure 15:
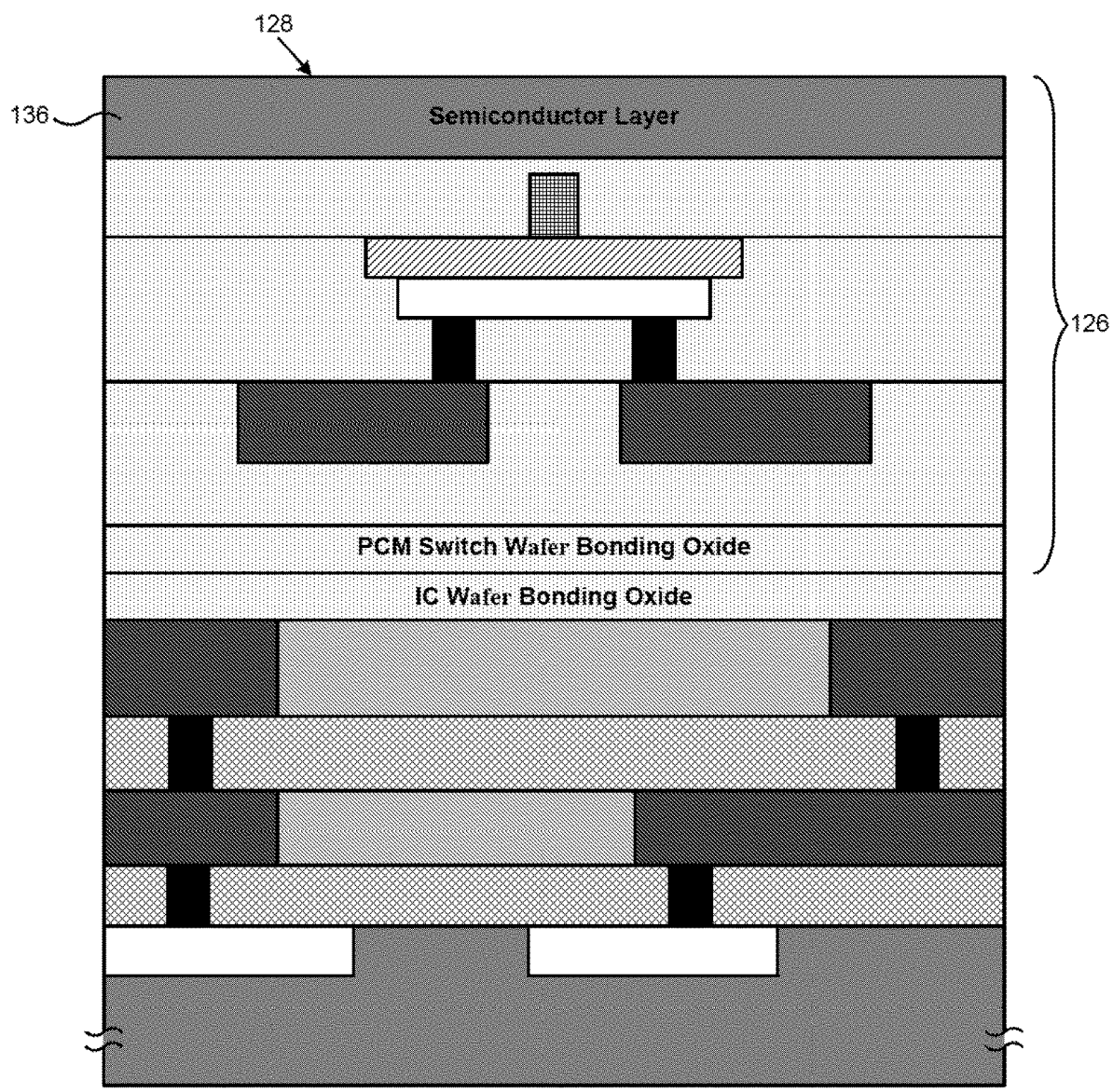
Figure 16:
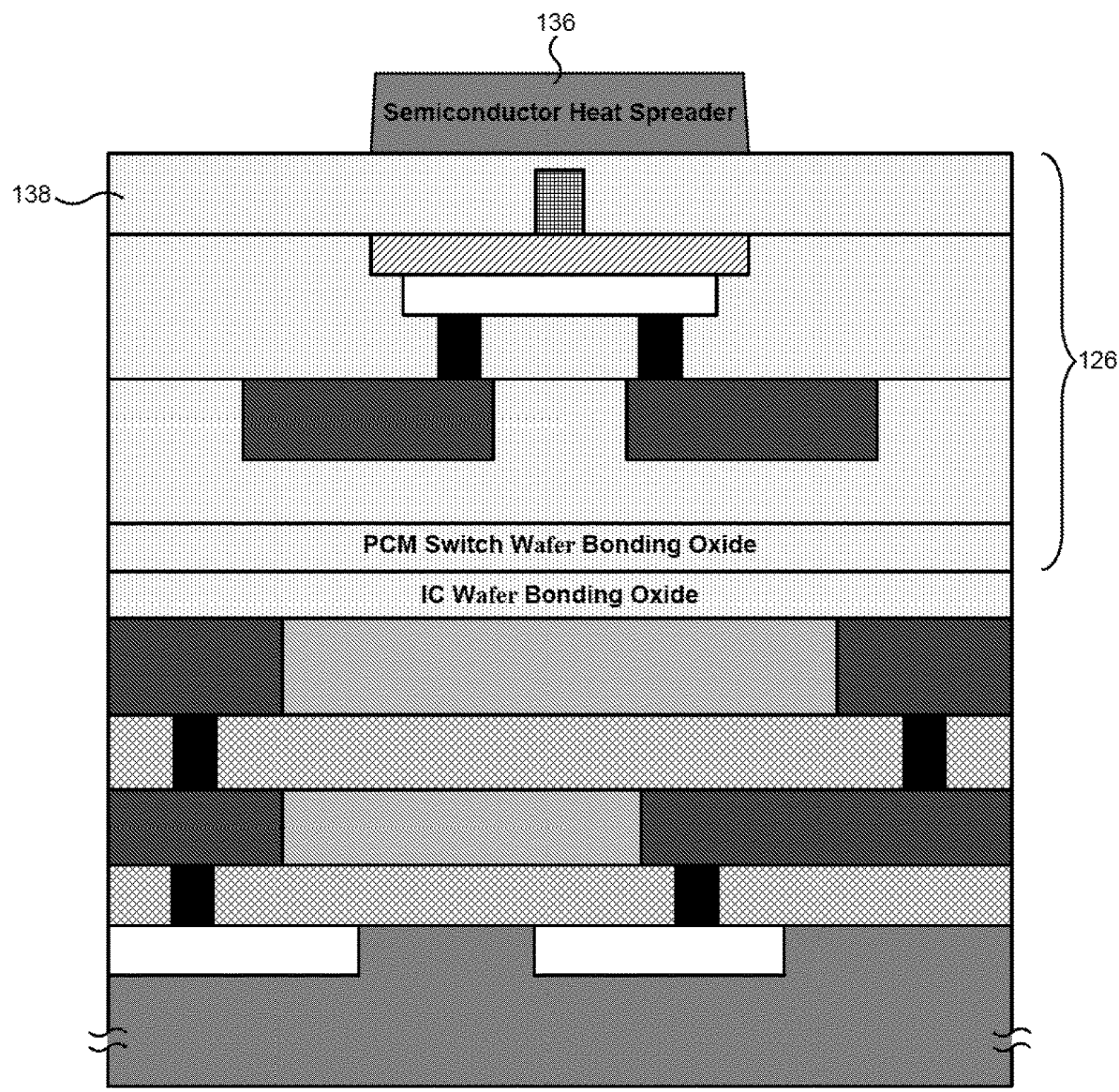

FIGS. 14 through 16 illustrate cross-sectional views of portions of a bonded structure processed in accordance with action 122 in the flowchart of FIG. 11 according to one implementation of the present application. As shown in FIG. 14, substrate 132 (shown in FIG. 13) is removed from heat spreading side 128 of PCM switch wafer 126. In one implementation, substrate 132 (shown in FIG. 13) is removed using two actions. In the first action a grinding process can be used to remove a large portion of substrate 132 (shown in FIG. 13). In the second action an etching process can be used to remove a remaining portion of substrate 132 (shown in FIG. 13). The etching process can etch to and stop at etch stop layer or buried oxide layer 134 using a selective etch. Substrate 132 (shown in FIG. 13) can be aggressively etched without etching semiconductor layer 136. As a result, semiconductor layer 136 (which performs as a heat spreader in a final bonded two-die device, as described below) will maintain its thickness, and the reliability of the bonded two-die device is improved.

As shown in FIG. 15, etch stop layer or buried oxide layer 134 (shown in FIG. 14) is removed from heat spreading side 128 of PCM switch wafer 126, leaving semiconductor layer 136. Where etch stop layer or buried oxide layer 134 (shown in FIG. 14) is a heavily doped (e.g., P++) epitaxial silicon, it can be removed, for example, using a chemical dry etch. Where etch stop layer or buried oxide layer 134 (shown in FIG. 14) is a BOX layer, it can be removed, for example, using a chemical wet etch. As shown in FIG. 16, semiconductor layer 136 is patterned. In PCM switch wafer 126, a portion of semiconductor layer 136 remains on lower dielectric 138. Because semiconductor layer 136 performs as a heat spreader in a final bonded two-die device, it will also be referred to as semiconductor heat spreader 136 in the present application. As shown in FIG. 16, action 122 of the flowchart of FIG. 11 results in patterning semiconductor heat spreader 136 in PCM switch wafer 126.

Figure 17:
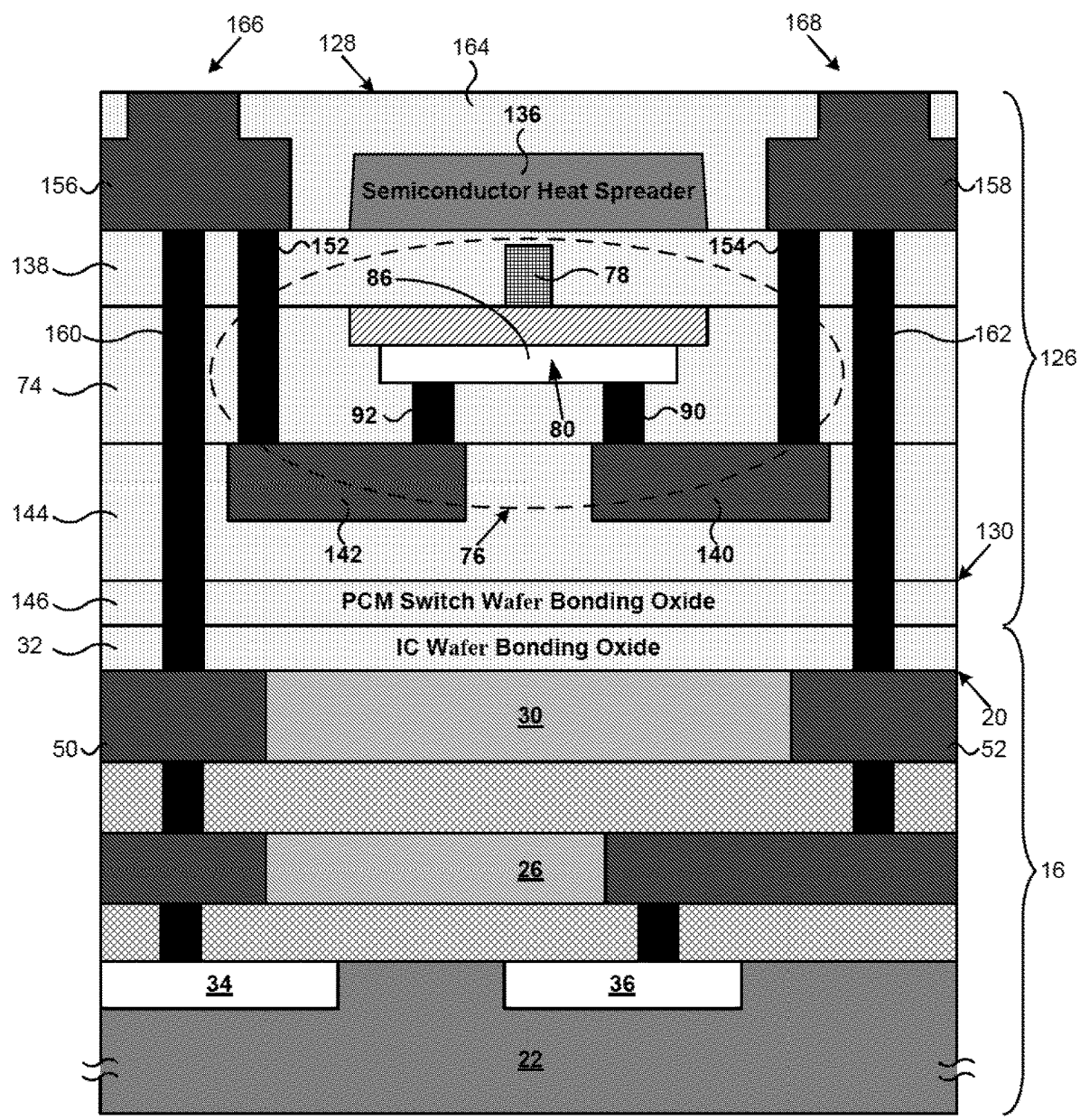
FIG. 17 illustrates a cross-sectional view of a portion of a bonded structure processed in accordance with the flowchart of FIG. 11 according to one implementation of the present application.

FIG. 17 illustrates a cross-sectional view of a portion of a bonded structure processed in accordance with action 124 in the flowchart of FIG. 11 according to one implementation of the present application. As shown in FIG. 17, RF terminals 90 and 92 in PCM RF switch 76 of PCM switch wafer 126 are electrically connected to active devices 34 and 36, respectively, in substrate 22 of IC wafer 16. Interconnect metals 140 and 142 are situated in interconnect dielectric 144 and connected to RF terminals 90 and 92 respectively. Vias 152 and 154 extend through contact dielectric 74 and lower dielectric 138. Via 152 connects interconnect metal 142 to interconnect metal 156. Via 154 connects interconnect metal 140 to interconnect metal 158. Interconnect metals 156 and 158 are situated on lower dielectric 138. Vias 160 and 162 extend through lower dielectric 138, contact dielectric 74, interconnect dielectric 144, PCM switch wafer bonding oxide 146, and IC wafer bonding oxide 32. Via 160 connects interconnect metal 156 in PCM switch wafer 126 to interconnect metal 50 in IC wafer 16. Via 162 connects interconnect metal 158 in PCM switch wafer 126 to interconnect metal 52 in IC wafer 16. PCM switch wafer 126 can be electrically connected to more or fewer active devices in IC wafer 16 than shown in FIG. 17, and can be connected using more or fewer interconnect metals and/or vias.

Upper dielectric 164 is formed on interconnect metals 156 and 158 at heat spreading side 128 of PCM switch wafer 126. In various implementations, upper dielectric 164 can comprise $Si_xO_y$, $Si_xN_y$, or another dielectric. Pad openings 166 and 168 are formed in upper dielectric 164 on interconnect metals 156 and 158 respectively. Pad openings 166 and 168 provide external connections for the bonded two-die device of FIG. 17. The bonded two-die device of FIG. 17 can have more or fewer pad openings than shown in FIG. 17.

The bonded two-die device of FIG. 17 manufactured according to the flowchart of FIG. 11 provides several advantages. For example, because the methods of the present application form semiconductor heat spreader 136 in PCM switch wafer 126, and then bond RF terminal side 130 of PCM switch wafer 126 to metallization side 20 of IC wafer 16, semiconductor heat spreader 136 can comprise monocrystalline semiconductor layers without damaging metallization structures formed in first metallization level 26 and second metallization level 30. Semiconductor heat spreader 136 on heat spreading side 128 of PCM switch wafer 126 effectively dissipates heat generated by heating element 78 of PCM RF switch 76. Thus, active segment 86 of PCM 80 can rapidly quench and successfully transform phases, and PCM RF switch 76 can switch states with improved reliability. Semiconductor heat spreader 136 comprising monocrystalline semiconductor layers also improves the reliability of the bonded two-die device of FIG. 17. Further, the bonded two-die device of FIG. 17 efficiently integrates PCM RF switch 76 and active devices 34 and 36.

Notably, the bonded two-die device of FIG. 17 manufactured according to the flowchart of FIG. 11 and the bonded two-die device of FIG. 10 manufactured according to the flowchart of FIG. 1, each have respective advantages. Because the bonded two-die device of FIG. 10 manufactured according to the flowchart of FIG. 1 bonds PCM switch wafer 54 prior to forming PCM RF switch 76, PCM switch wafer 54 is generally smaller during the bonding action, and alignment may be performed more accurately. Additionally, because heat spreading side 56, rather than RF terminal side 58, of PCM switch wafer 54 is bonded to metallization side 20 of IC wafer 16, it may be possible to reduce the number of routing structures, such as interconnect metals 98 and 100 and vias 102 and 104, used to connect RF terminals 90 and 92 to active devices 34 and 36.

Because the bonded two-die device of FIG. 17 manufactured according to the flowchart of FIG. 11 forms PCM RF switch 76 prior to bonding PCM switch wafer 126, less processing steps are performed after the bond is formed at the interface of PCM switch wafer bonding oxide 146 and IC wafer bonding oxide 32. As a result, voids are less likely to form at the interface, and the strength and reliability of the bond are improved. It is noted that in all various implementations described above in the present application, "metallization side" of the IC wafer can also be the back side of the IC wafer that includes a blanket metallization layer and/or patterned metallization layers, that may be connected to through semiconductor vias (TSV) for electrical connection to devices or circuits in the IC wafer, as opposed to the interconnect metallization side 20 (for example shown in FIG. 4) specifically described above with respect to various implementations.

Thus, various implementations of the present application achieve wafer-to-wafer and/or die-to-wafer bonding and result in bonded two-die devices including PCM switch dies and IC dies and which utilize the inventive PCM RF switch of the present application to overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A bonded two-die device comprising:
an integrated circuit (IC) die including at least one active device, said IC die having an IC substrate side and a metallization side;
a phase-change material (PCM) switch die, said PCM switch die having a heat spreading side and a radio frequency (RF) terminal side, said PCM switch die including a heating element between a heat spreader and a PCM;
said heat spreading side of said PCM switch die being bonded to said metallization side of said IC die.

2. The bonded two-die device of claim 1, further comprising a bonding oxide between said heat spreading side of said PCM switch die and said metallization side of said IC die.

3. The bonded two-die device of claim 1, wherein said heat spreader is a semiconductor heat spreader comprising epitaxial silicon or bulk silicon.

4. The bonded two-die device of claim 1, wherein said at least one active device in said IC die comprises a CMOS device, a BiCMOS device, a SiGe device, or a group III-V device.

5. The bonded two-die device of claim 1, wherein said PCM in said PCM switch die comprises passive segments and an active segment, wherein RF terminals of said PCM switch die are connect to said passive segments, and wherein said heating element is transverse to said PCM and is aligned with said active segment.

6. A bonded two-die device comprising:
an integrated circuit (IC) die including at least one active device, said IC die having an IC substrate side and a metallization side;
a phase-change material (PCM) switch die, said PCM switch die having a heat spreading side and a radio frequency (RF) terminal side, said PCM switch die including a heating element between a heat spreader and a PCM;
said RF terminal side of said PCM switch die being bonded to said metallization side of said IC die.

7. The bonded two-die device of claim 6, further comprising a bonding oxide between said RF terminal side of said PCM switch die and said metallization side of said IC die.

8. The bonded two-die device of claim 6, wherein said heat spreader is a semiconductor heat spreader comprising epitaxial silicon or bulk silicon.

9. The bonded two-die device of claim 6, wherein said at least one active device in said IC die comprises a CMOS device, a BiCMOS device, a SiGe device, or a group III-V device.

10. The bonded two-die device of claim 6, wherein said PCM in said PCM switch die comprises passive segments and an active segment, wherein RF terminals of said PCM switch die are connected to said passive segments, and wherein said heating element is transverse to said PCM and is aligned with said active segment.

11. The bonded two-die device of claim 1, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

12. The bonded two-die device of claim 1, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

13. The bonded two-die device of claim 6, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

14. The bonded two-die device of claim 6, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

15. A bonded two-die device comprising:
an integrated circuit (IC) die including at least one active device, said IC die having an IC substrate side and a metallization side;
a phase-change material (PCM) switch die, said PCM switch die having a heat spreading side and a radio frequency (RF) terminal side;
said heat spreading side of said PCM switch die being bonded to said metallization side of said IC die.

16. The bonded two-die device of claim 15, further comprising a bonding oxide between said heat spreading side of said PCM switch die and said metallization side of said IC die.

17. The bonded two-die device of claim 15, wherein said heat spreader is a semiconductor heat spreader comprising epitaxial silicon or bulk silicon.

18. The bonded two-die device of claim 15, wherein said at least one active device in said IC die comprises a CMOS device, a BiCMOS device, a SiGe device, or a group r-V device.

19. The bonded two-die device of claim 15, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

* * * * *